United States Patent [19]

Cobaugh et al.

[11] 4,186,982

[45] Feb. 5, 1980

[54] CONTACT WITH SPLIT PORTION FOR ENGAGEMENT WITH SUBSTRATE

[75] Inventors: Robert F. Cobaugh, Elizabethtown; James R. Coller, Mechanicsburg, both of Pa.

[73] Assignee: AMP Incorporated, Harrisburg, Pa.

[21] Appl. No.: 810,703

[22] Filed: Jun. 28, 1977

Related U.S. Application Data

[63] Continuation-in-part of Ser. No. 698,240, Jun. 21, 1976, abandoned, which is a continuation of Ser. No. 481,577, Jun. 21, 1974, abandoned, which is a continuation-in-part of Ser. No. 440,899, Feb. 8, 1974, abandoned, which is a continuation-in-part of Ser. No. 384,852, Aug. 1, 1973, abandoned.

[51] Int. Cl.² .......... H05K 1/12

[52] U.S. Cl. .......... 339/17 C; 339/221 M

[58] Field of Search .......... 339/17 R, 17 C, 217 S, 339/220 R, 221 R, 221 M, 252 R, 252 P; 85/1 F

[56] References Cited

U.S. PATENT DOCUMENTS

| | | | |
|---|---|---|---|
| 2,183,067 | 12/1939 | Gardner | 339/252 P |
| 2,294,608 | 9/1942 | Rudolphsen | 339/252 P |
| 2,542,609 | 2/1951 | Wyglendowski | 339/252 P |
| 3,400,358 | 9/1968 | Byrnes et al. | 339/242 |
| 3,416,122 | 12/1968 | Kinkaid | 339/221 |
| 3,696,323 | 10/1972 | Kinkaid et al. | 339/17 C |
| 3,783,433 | 1/1974 | Kurtz et al. | 339/217 S |

FOREIGN PATENT DOCUMENTS

| | | | |
|---|---|---|---|
| 736058 | 9/1932 | France | 85/1 F |
| 1426275 | 12/1965 | France | 339/252 P |

*Primary Examiner*—Neil Abrams
*Attorney, Agent, or Firm*—AMP Incorporated

[57] ABSTRACT

A contact for use in printed circuit boards in which a portion thereof is split or sheared to form at least a pair of legs for insertion into an aperture in said circuit board with the adjacent legs each having a surface which face and abut each other in the shear plane therebetween and with said legs being offset with respect to each other in said shear plane. When the offset legs are inserted in an aperture in a circuit board they are forced towards each other along the shear plane with the facing surfaces experiencing a strong component of force normal to said shear plane. Such normal force in turn produces a large frictional force between said facing surfaces which, together with the spring-like force generated as the legs are forced together, produce a strong opposing force against the walls of the aperture. The foregoing structure enables the use of compliant legs having a larger total cross-sectional area with respect to a printed circuit board aperture of a given size than has heretofore been possible. Further, because of such larger cross-sectional area and the large frictional contact between the leg surfaces in the plane of shear the said legs exert a greater force against the wall of the printed circuit board hole without damaging said wall than obtainable with prior devices, thereby creating both an improved electrical contact and an improved mechanical contact. In some embodiments of the invention means are provided to control the direction and amount of rotation of the legs as they are inserted into the printed circuit board aperture.

38 Claims, 22 Drawing Figures

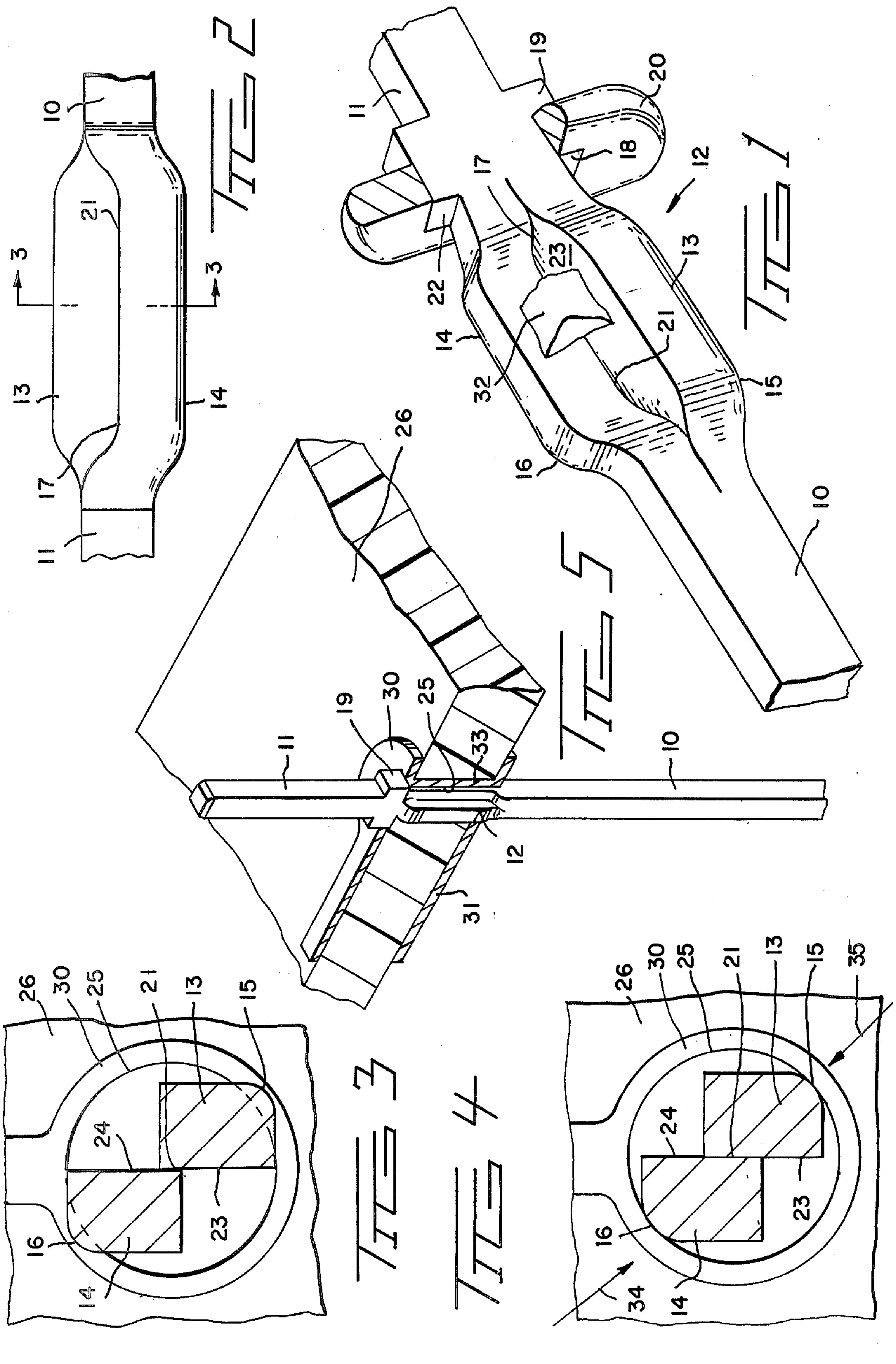

F I G. 9
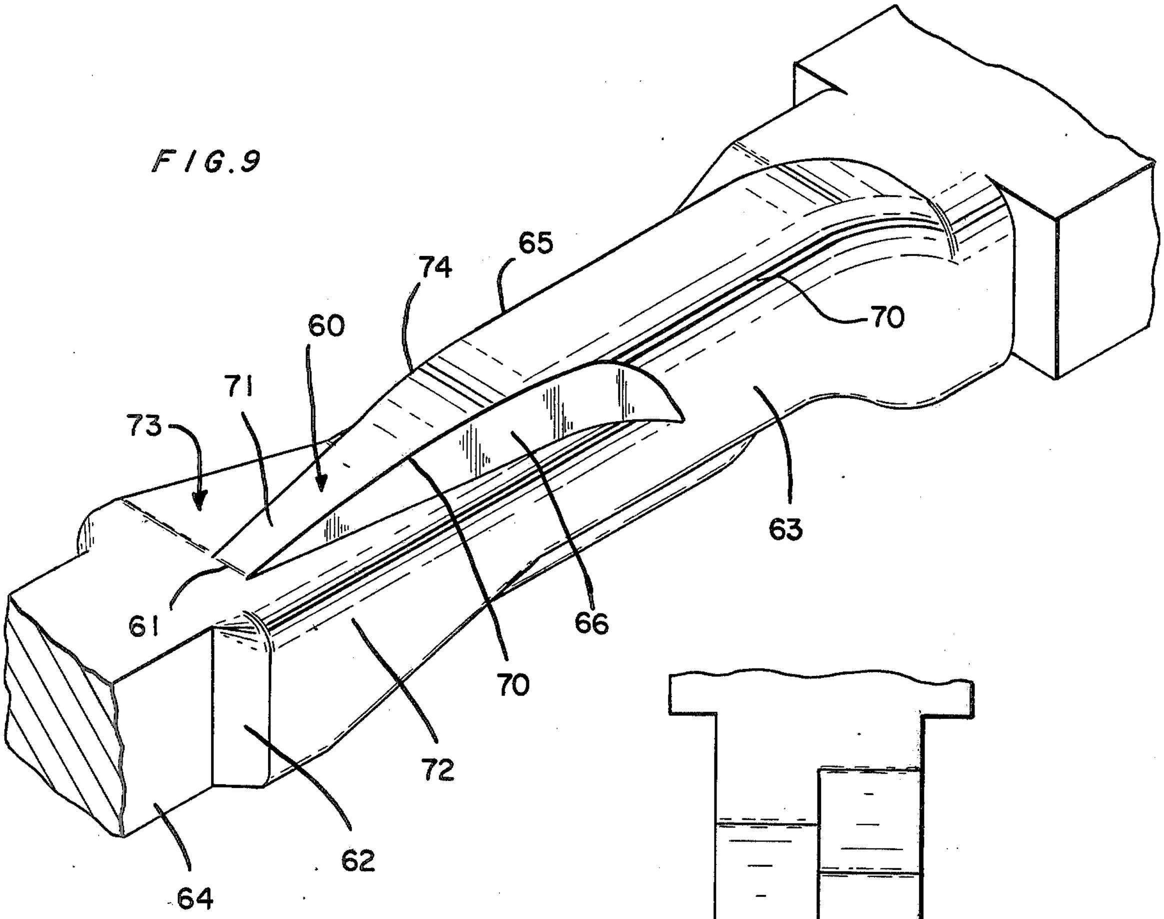
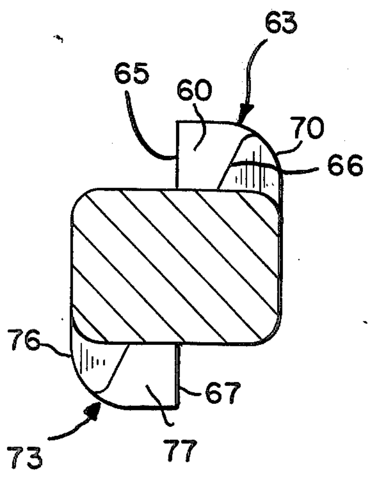
F I G. 11
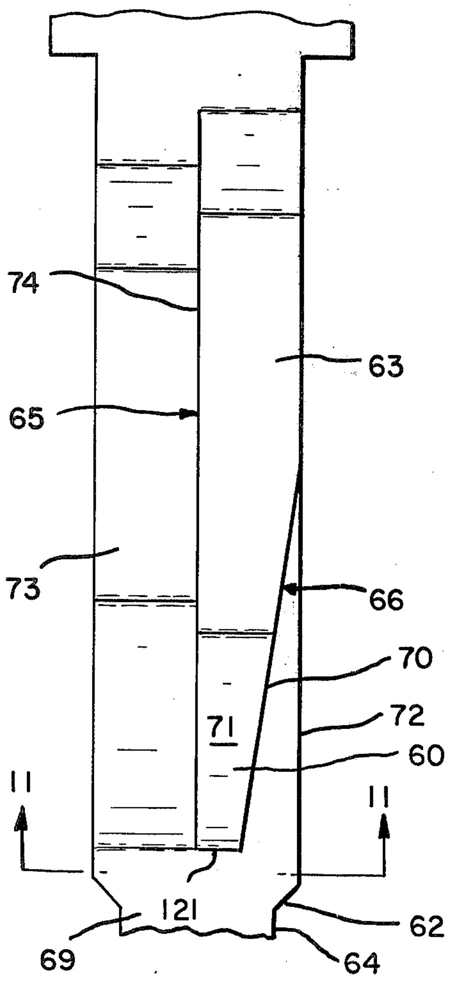
F I G. 10

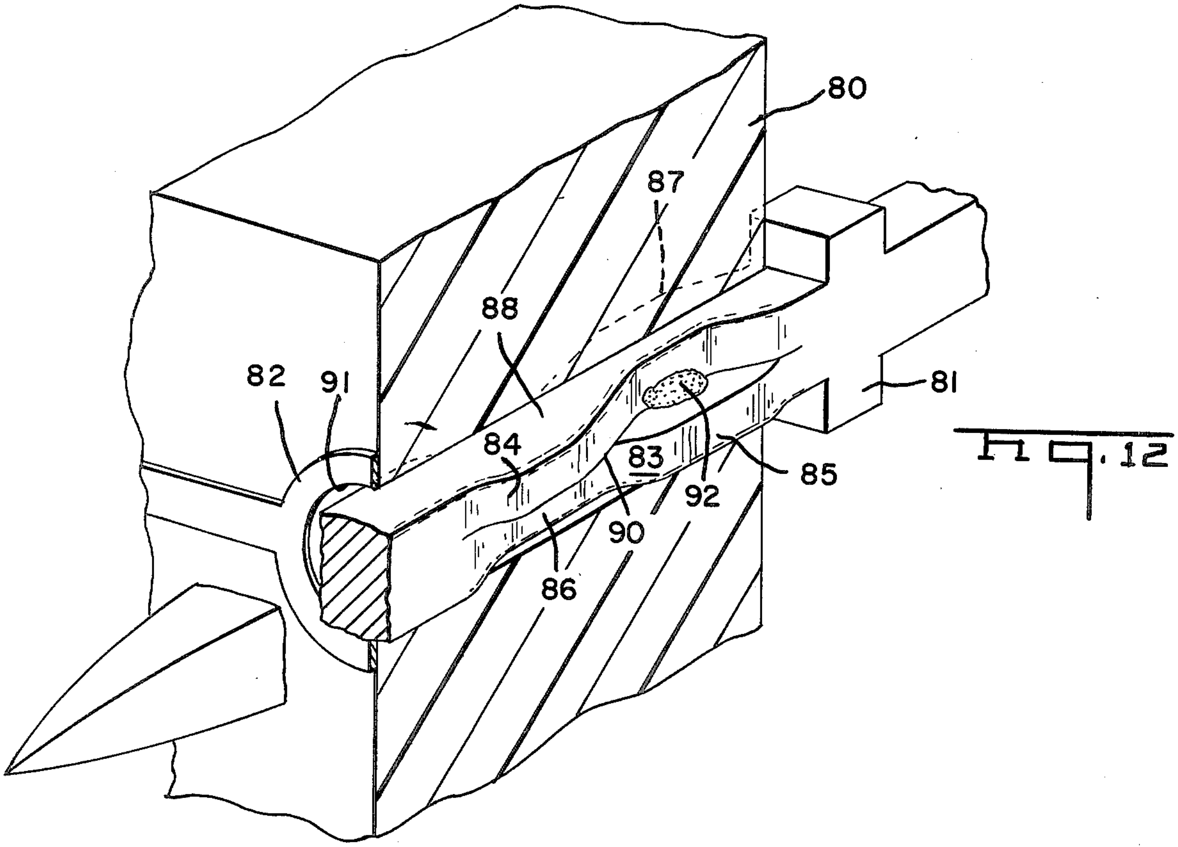
Fig. 12
Fig. 13
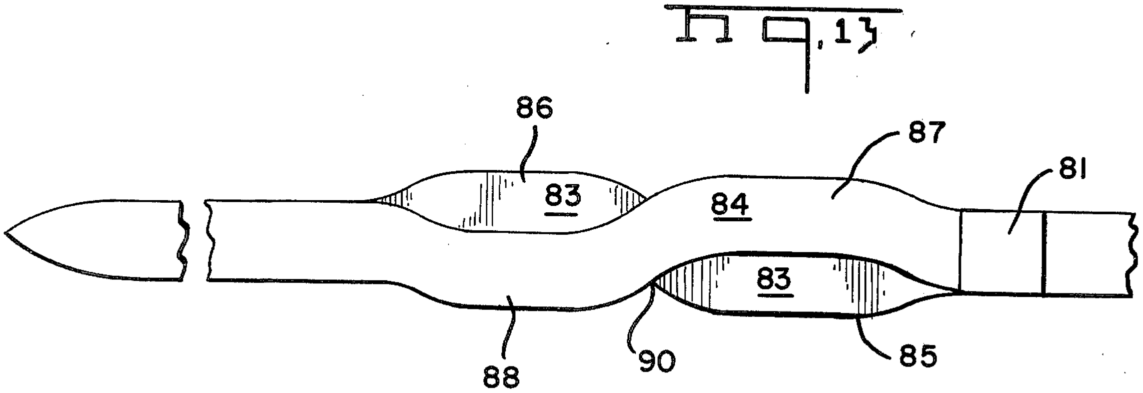
Fig. 14
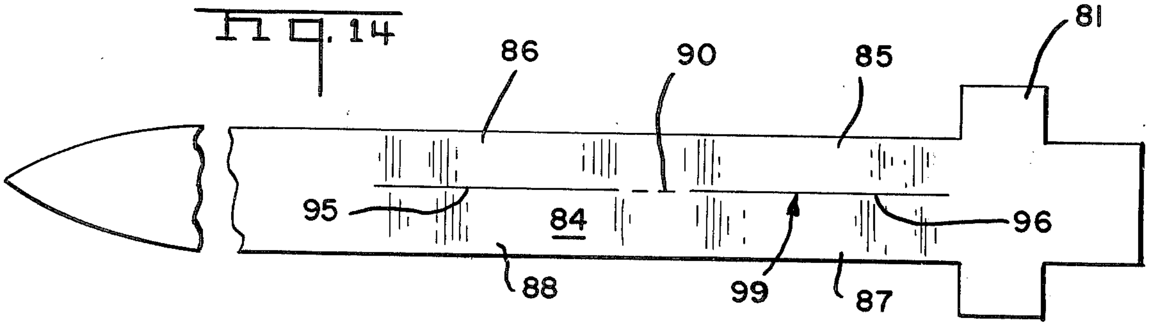

Fig. 15
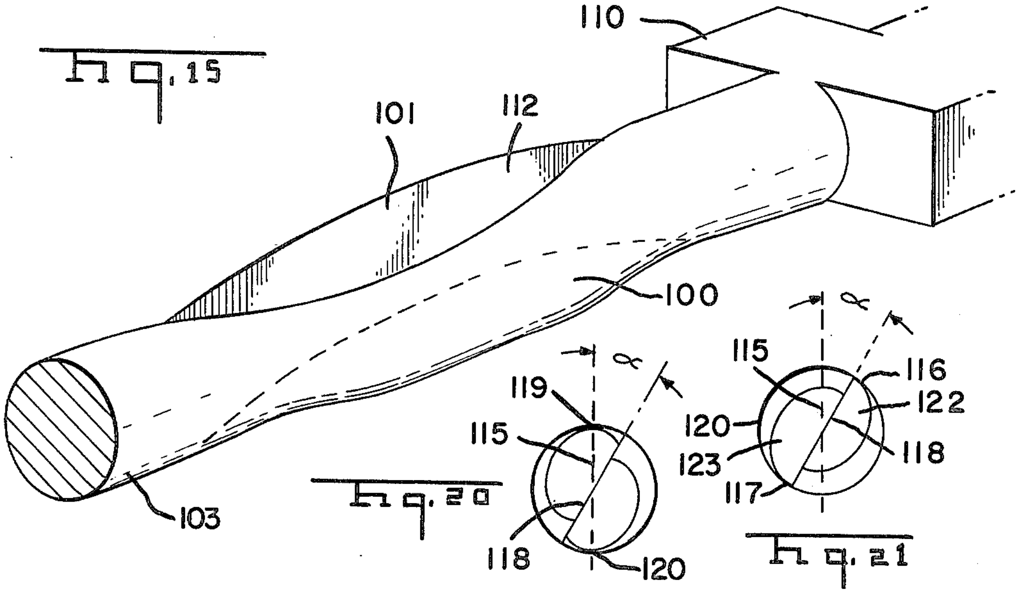
Fig. 20
Fig. 21
Fig. 16
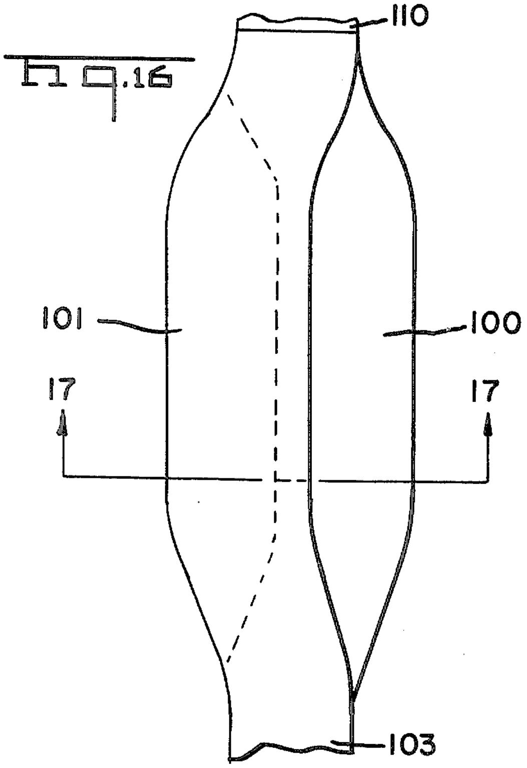
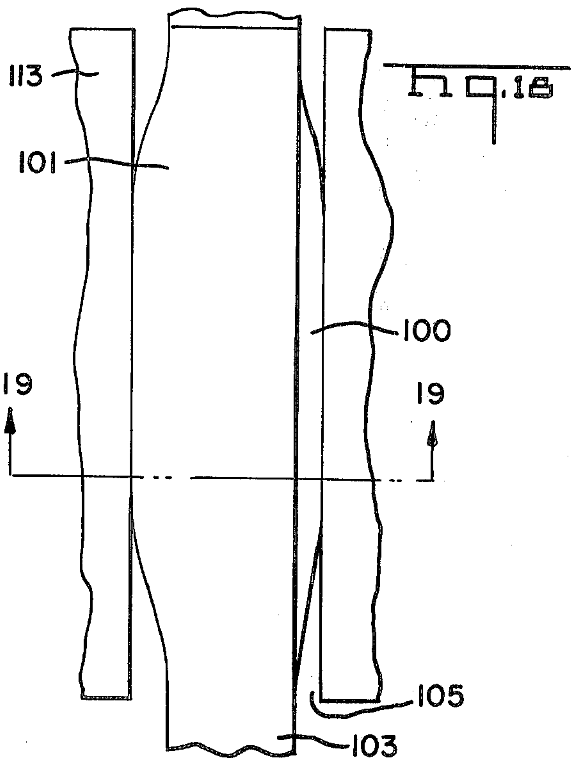
Fig. 18
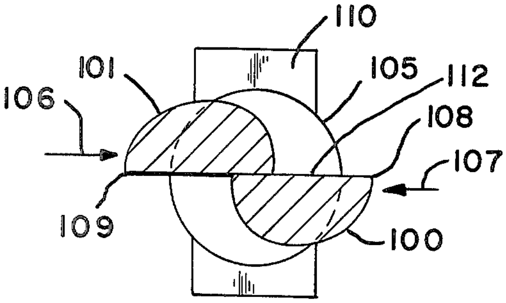
Fig. 17
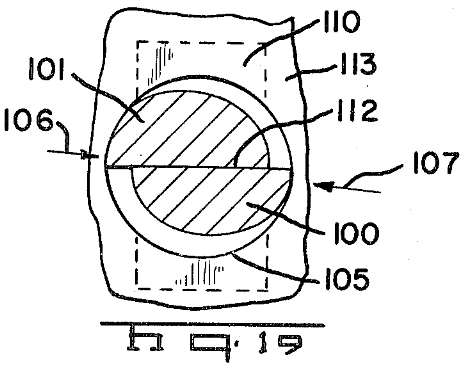
Fig. 19

CONTACT WITH SPLIT PORTION FOR ENGAGEMENT WITH SUBSTRATE

CROSS-REFERENCE TO RELATED APPLICATIONS

This application is a continuation-in-part of application Ser. No. 698,240 filed June 21, 1976, by Robert Franklin Cobaugh and James Ray Coller entitled "Split Pin Terminal", now abandoned which is in turn a continuation of abandoned application Ser. No. 481,577 filed June 21, 1974, by Robert Franklin Cobaugh and James Ray Coller entitled "Split Pin Terminal" which is in turn a continuation-in-part of application Ser. No. 440,899 filed Feb. 8, 1974, entitled "Split Pin Terminal" by Robert Franklin Cobaugh and James Ray Coller, now abandoned, which is in turn a continuation-in-part of application Ser. No. 384,852 filed Aug. 1, 1973, by Robert Franklin Cobaugh and James Ray Coller entitled "Split Pin Terminal", also now abandoned.

BACKGROUND OF THE INVENTION

This invention relates generally to contacts or pins constructed to be inserted through apertures in printed circuit boards and more particularly it relates to contacts having a split or sheared portion which forms a pair of offset legs which fit into, and grip the sides of, holes provided therefor in printed circuit boards.

The current use of terminal posts retained in apertures in printed circuit boards is quite extensive. For several years such retention has been accomplished by inserting a square post into a round aperture with the four edges of the post frictionally engaging the aperture walls. Such an arrangement presents several problems, with one of the most difficult being the small variation in hole size and pin size that can be tolerated, either with or without the use of solder. Without solder such variation of size usually cannot exceed an accumulation of more than two or three thousandths of an inch. Outside such tolerance limits the square post will either have insufficient retention force or literally fall out of the hole or, on the other hand, the force required to insert the post will be too large and sometimes destroy the walls of the aperture.

If solder is employed, contact must still be made between the edges of the post and the aperture walls in order for solder to flow thoroughly in-between the post and the aperture walls. If the post is too large, problems of high insertion force and damage to the aperture walls are present.

The problem attendant with inserting a square post in a round aperture has led to the development of other types of aperture engaging means. One such development employs a post having a portion which is compliant and can give as it enters the aperture, thereby permitting greater dimensional tolerances. In one form such compliant portion is split along the longitudinal axis thereof to form a pair of legs. The two legs are spread apart to form a configuration similar to that of an eye of a needle so that when they are inserted into the circuit board hole they act as a pair of oppositely bowed spring members and provide an outwardly directed force against the wall of the hole, thereby creating both an electrical contact and a mechanical friction fit with the wall of the circuit board aperture.

One difficulty with such a structure involves the amount of material in the legs, i.e., the maximum cross sectional area of the legs with respect to the size of the aperture in which the contact is to be inserted. More specifically, since the two legs are spread apart it is necessary that the aperture be of sufficient size to receive the legs and also to insure that the legs are not pressed together any farther than the original configuration of the flattened portion before the splitting thereof occurs. Further, the retention force between the legs and the aperture wall is limited by the resiliency of the legs as they are pressed together.

With such prior art structure the total cross-sectional area of the legs is relatively small compared with the hole size in the printed circuit board. Since it is usually desired to keep the holes in the printed circuit board as small as possible the legs will, in fact, have a correspondingly small cross-sectional area, thereby limiting the amount of spring and strength of said legs to a point where they are not practical unless they are soldered into the aperture.

The cross-sectional size of the legs could, of course, be increased simply by enlarging the circuit board hole. Such a solution, however, usually is unsatisfactory since space on a printed circuit board is limited. For example, pins on a printed circuit board are often spaced closely together in either a matrix or a row so that enlarging the holes would result in an undesired decrease of pin density.

BRIEF STATEMENT OF THE INVENTION

A primary object of the invention is to provide a contact having a split portion forming at least a pair of offset compliant legs which, upon insertion into a circuit board aperture are caused to move towards each other along abutting surfaces, and which have a strong normal force created between said abutting surfaces to force the two legs together and thereby produce a substantial frictional force between the abutting surfaces that resists the movement of said legs towards each other, and results in a substantially greater force between the legs and the sides of the aperture than has heretofore been obtainable with compliant circuit board aperture engaging means.

A second purpose of the invention is to provide a contact having a portion thereof split or sheared to form a pair of legs which are physically offset with respect to each other along the shear plane and which move towards each other along said shear plane with a strong force component normal to said shear plane as said legs are inserted in the printed circuit board hole, and thereby enabling a relatively small printed circuit board aperture to receive contacts of a relatively large cross-sectional area, and with a large frictional force between the legs in the shear plane which produces a large opposing force on the walls of the circuit board aperture without damaging said walls.

It is a third object of the invention to provide a contact having a sheared portion which forms two legs having facing and abutting surfaces in the plane of shear and which are offset in said plane of shear, and further which have a total cross-sectional area that is larger for a given hole area in the printed circuit board than has heretofore been obtainable for multiple leg circuit board aperture engagement structures.

A fourth purpose of the invention is to provide a contact having a portion which is sheared to form a pair of legs offset in opposite directions along the plane of shear and insertable in a circuit board aperture and having means for controlling the amount and direction of rotation of said legs as they are inserted in said aperture.

A fifth purpose of the invention is the improvement generally of contacts having split portions which form offset, compliant legs which are insertable and retainable in holes in printed circuit boards.

In accordance with one form of the invention there is provided a contact having a portion insertable through and retainable within an aperture formed in a printed circuit board. Such portion is split or sheared longitudinally to form two legs, each having a generally square or rectangular cross-sectional configuration and each having a given surface which face and abut each other and which lie in the common shear plane. The two legs are bowed in opposite directions parallel to the shear plane so as to be offset with respect to each other, and with their outer surfaces being convex and generally perpendicular to said common shear plane and defining the amount of offset. As the legs are inserted into a circuit board aperture a force is created between the diagonally positioned edges of the legs and the walls of the circuit board aperture. Such force moves the legs towards each other along the common plane and also presses said legs together in a direction normal to said common plane to increase the frictional force between the said given surfaces of the legs in said common shear plane. Such frictional force usually is substantially greater than the spring-like force created by the resilient nature of the legs as they are moved towards each other along said common plane.

In accordance with another form of the invention, the ends of the two legs which enter the circuit board aperture first are formed into pyramidal-like configurations having a trapezoidally-shaped cross-section with the apex of the pyramids facing towards and located near said first entering ends of said legs and lying in, or in close proximity to, said common plane. Each pyramidal-like configuration is defined on one side by the common plane and on the other side by a surface which extends inwardly from the outermost convex surface of the leg to a depth substantially equal to the distance of offset of the convex surface and extending from the apex at an angle away from said common shear plane to the surface of the leg. Such pyramidal-like configurations result in forces upon said legs as they are inserted into a circuit board aperture to control the amount and direction of pin rotation which occurs during said insertion.

In accordance with yet another form of the invention the ends of said legs which first enter the circuit board aperture are terminated in a wedge-shaped configuration having a trapezoidally-shaped cross-sectional area with a first side lying substantially in said common plane and with the converging end of the wedge being substantially perpendicular to said first side and terminating in the convex surface of the leg near the first entering end thereof. In this form of the invention the converging end of the wedge-shaped configuration is not an apex lying in a common plane but rather is an edge having a width, such as the sharp end of a chisel. The wedge-shaped configurations are defined on the side opposite said first side by a surface extending inwardly into said leg from the convex surface thereof to a depth substantially equal to the offset distance of said convex surface and further extending from the converging end of said wedge-shaped configuration outwardly at an angle from said first side to the surface of said leg.

In accordance with still another form of the invention each of the two legs is generally S-shaped, with one of the S-shaped legs being reversed with respect to the other, so that corresponding halves of each of the two S-shaped legs are offset in opposite directions with respect to each other to form a figure 8-like configuration. Each leg has a first surface facing and abutting each other and laying in the common shear plane. Thus, when the pin is inserted into a circuit board aperture the walls of the aperture exert a force upon the two S-shaped legs, tending to straighten the two legs and to cause them to slide towards each other along said common plane, and thereby providing a force between the diagonally positioned outside edges of the S-shaped legs and the walls of the circuit board aperture into which they are inserted. As in the case where the legs are bowed only once in opposite directions the frictional force which is created between said first surfaces due to the force normal to the shear plane is usually greater than the spring-like forces which are created as the legs are forced together along the common shear plane.

In accordance with a fifth form of the invention the configuration of the terminal can be generally oval, elliptical or circular in cross-sectional area. In the case of an oval of elliptical cross-sectional area the shear plane can be along the major or minor axis or at a relatively small angle thereto. If the shear plane is along the minor axis, or at a small angle thereto, the forces between the legs and the aperture wall are large since they include a large frictional force between the facing and abutting surfaces of the legs laying in the common shear plane. If the shear plane is near the major axis the forces between the legs and the aperture wall are near the shear plane and less total force between the legs and the aperture wall is created since a relatively small frictional force is generated between the facing surfaces of the legs laying in the common shear plane.

In accordance with a feature of the invention, the diagonally positioned outside edges of both the single bowed legs and the S-shaped legs have their outer edges rounded so as to provide greater contact area between the legs and the walls of the circuit board aperture.

In accordance with another feature of the invention as the legs are moved towards each other during insertion in a circuit board aperture with their two facing surfaces moving in said common shear plane, the frictional forces between said two facing surfaces becomes increasingly greater and more dominant to the point where, in many cases, the two legs begin to appear as a solid post to the aperture wall even though additional force pushing the legs together would cause some additional sliding of the two legs along said common shear plane.

In accordance with yet another feature of the invention the contact can be terminated at the ends of the legs which first enter a circuit board aperture with such first entering ends of the legs being either connected together or separated and with the aperture extending either entirely through the substrate or only part way through.

In accordance with a further feature of the invention it will be apparent that the number of legs can exceed two.

BRIEF DESCRIPTION OF THE DRAWINGS

The above-mentioned and other objects and features of the invention will be more fully understood from the following detailed description thereof when read in conjunction with the drawings in which:

FIG. 1 is a perspective view of the invention;

FIG. 2 is a plan view of the structure of FIG. 1;

FIG. 3 is a sectional view showing of the end view of the two legs of the contact taken along the plane 3—3 of FIG. 2, and their relationship with each other and the aperture of a printed circuit board prior to insertion of the pin into said aperture;

FIG. 4 is a sectional showing of the two legs of the contact after insertion into the aperture of the printed circuit board;

FIG. 5 shows a perspective broken away view of a contact inserted through a printed circuit board;

FIG. 9 is a perspective view of another form of the invention in which the legs terminate in a wedge-shaped configuration having a line-like junction on the surface of the contact rather than an apex;

FIG. 10 is a top view of the structure of FIG. 9;

FIG. 11 is a sectional view of the structure of FIG. 10 taken along the plane 11—11;

FIG. 12 is a perspective, broken away view of a circuit board containing the form of the invention employing two S-shaped legs;

FIG. 13 is a side view of the embodiment of the form of the invention shown in FIG. 12;

FIG. 14 is a view of the two split pins of FIG. 13 rotated 90° and illustrating that the two S-shaped legs have adjoining and abutting surface areas which lie in a common plane;

FIG. 15 is a perspective view of another form of the invention in which the cross-sectional area configuration of the legs are such that the forces exerted thereon remain adjacent or very close to the common shearing plane and opposed to each other by 180°;

FIG. 16 is a side view of a portion of the structure of FIG. 15 before insertion into a printed circuit board aperture;

FIG. 17 is a sectional view of FIG. 16 taken along the plane 17—17;

FIG. 18 is a side view of the structure of FIG. 15 after insertion into a printed circuit board aperture;

FIG. 19 is a sectional view of FIG. 18 taken along the plane 19—19;

FIG. 20 is an end view of a pair of legs formed from an oval-shaped post and inserted in a substrate aperture;

FIG. 21 is a view similar to FIG. 20 but with the legs moved in opposite directions along the shear plane.

DESCRIPTION OF THE INVENTION

Figure 6:
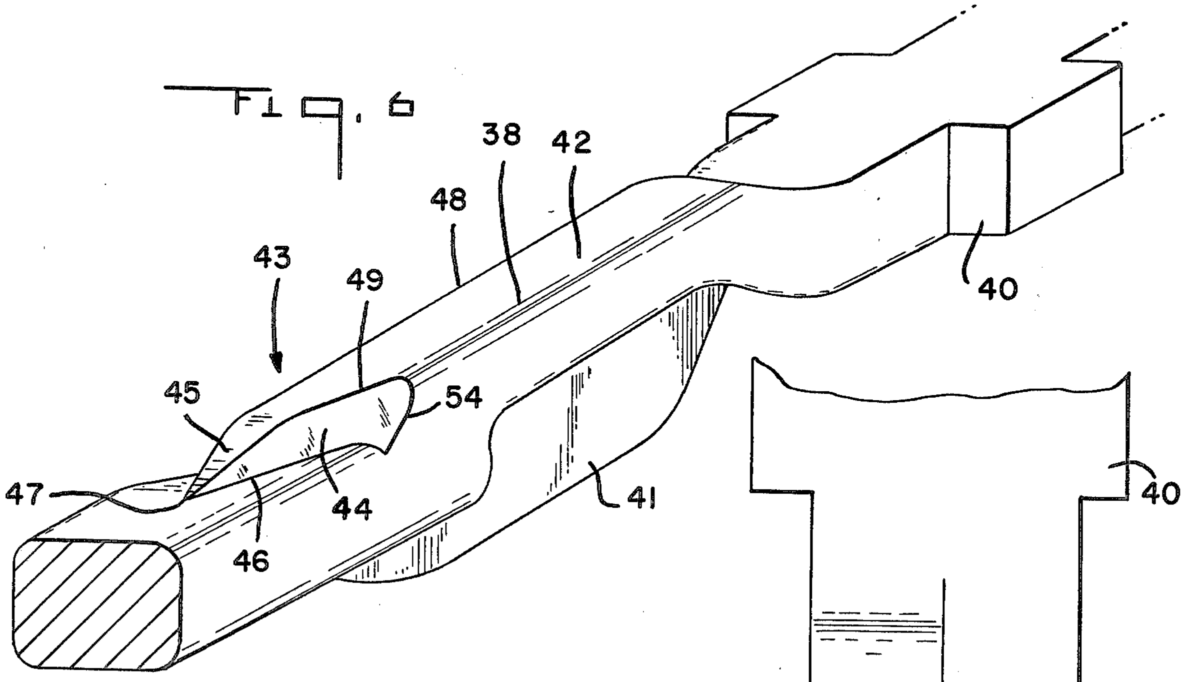
FIG. 6 is a perspective view of another embodiment of the invention in which the ends of the two legs are formed into a pyramidal-shaped configuration to prevent rotation of the legs as they are inserted in an aperture in a printed circuit board.

In FIG. 1 the contact comprises first end portion 10, second end portion 11 and split portion 12 which is connected between the first and second end portions 10 and 11 and insertable and engagable within an aperture in a substrate such as a printed circuit board. The term substrate can also encompass multi-layer printed circuit boards consisting of single sided or two sided boards permanently secured together or simply stacked one upon the other.

The perspective view of FIG. 1 shows the contact before insertion into an aperture in a substrate. It can be seen that the substrate engaging section 12 is comprised of two legs 13 and 14 which are separated from each other by means of slitting or shearing along plane 21. Also the two legs 13 and 14 are offset with respect to each other along shear plane 21, and having facing surfaces 23 and 24 which lie in plane 21, as is also shown in FIGS. 2, 3 and 4. The flange portion 19 provides a pair of shoulders 18 and 22 which seat the contact on the surface of a substrate in the manner shown in FIG. 5.

In most applications the contact of FIG. 1 can be inserted and effectively retained in an aperture in the substrate without the use of solder, as will be discussed in detail later herein. Generally, as the two legs are inserted into an aperture the diagonally positioned rounded edges 15 and 16 thereof come into contact with the aperture wall, as shown in FIGS. 3 and 4, to produce forces between edges 15 and 16 and said aperture walls. Such forces are designated by vectors 34 and 35 in FIG. 4 and tend to move the two legs towards each other along the common shear plane 21 and also force the two legs 13 and 14 together in a direction normal to said plane 21. The normal force produces a frictional force between facing surfaces 23 and 24 of legs 13 and 14 which is believed to be usually much larger than the resilient forces produced by the legs as they are moved together along common plane 21.

If desired a solder ring 20 may be positioned under or around the shoulders 18 and 20, or alternatively, a pocket of solder 32 can be provided. If either the solder ring 20 or the solder pocket 32 is provided the, after insertion of the legs into the printed circuit board, such solder can be melted to form a good electrical contact with an appropriate contact pad formed on the printed circuit board surface or with a conductive plating within the printed circuit board hole. As another alternative the contact of FIG. 1 can be sweat soldered into the aperture in the printed circuit board. Depending upon cost requirements and the particular application involved, the contact can be gold plated, silver plated, or tin plated for either a force fit or for installation with the use of solder.

Referring now more specifically to FIGS. 3 and 4, the action of the two legs when inserted into an aperture 25 in a printed circuit board 26 can be seen. In FIG. 3, which shows the legs 13 and 14 before insertion in the printed circuit board aperture 25, the greatest overall dimension of said two legs 13 and 14 exists between rounded edges 15 and 16 and can be seen to exceed the diameter of aperture 25 in printed circuit board 26.

In FIG. 4 the legs 13 and 14 have been inserted into the aperture 25 so that rounded edges 15 and 16 of legs 13 and 14, respectively, come into physical contact with the wall of aperture 25. It can further be seen that legs 13 and 14 which have a degree of compliancy are forced generally towards each other by force vectors 34 and 35. However, since the legs 13 and 14 are offset they will in fact move towards one another along the common shear plane 21 as they are inserted in printed circuit board aperture 25. Because of such movements a relatively wide range of hole diameters can be accommodated even though the total cross-sectional area of the legs 13 and 14 can be greater, for a given aperture size, than can be obtained with the prior art, single plane split pin configuration.

Further, it is important to note that legs 13 and 14 make contact with the wall of the aperture at points 15 and 16 to produce a strong component of force normal to the shear plane 21 between the two legs. Such normal force presses said legs together in the direction normal to the shear plane 21, thereby substantially increasing the frictional force etween the facing surfaces 23 and 24 of the legs which lay in the common plane 21. Such increased frictional force between the facing surfaces 23 and 24 of legs 13 and 14 creates a strong opposing force between the walls of the aperture and the contacting portions 15 and 16 of the two legs. Such opposing force, which is in addition to the spring-like force caused by compression of the legs together along the shear plane, is usually the dominant component of force in the retention of the terminal when inserted in a circuit board aperture. In almost all applications the force generated between the two legs of the contact and the circuit board aperture wall due solely to the spring-like or compliant nature of the legs would be insufficient. The added force due to the increased friction between the facing surfaces of the two legs along the common shear plane is needed to meet the requirements of most applications.

Upon full insertion of the legs 13 and 14 in the aperture 25 the frictional force between the facing surfaces 23 and 24 of legs 13 and 14 usually becomes so great that the two legs 13 and 14 begin to assume the properties of a single, solid post. If, however, sufficient additional force were to be applied to the legs 13 and 14 at points 15 and 16 the said legs 13 and 14 would move together an additional increment of distance along the shear plane 21 and thereby minimize the possibility of appreciable damage to the wall of aperture 25.

It is to be noted that the movement of the legs together is usually over a distance which exceeds the elastic limits of the legs so that some permanent deformation of the legs will occur when they are inserted into an aperture. However, a spring-like force will remain within the legs even after insertion in the circuit board aperture but will be measured from a new, nonstressed position of the legs which they will assume because of their being moved beyond their elastic limits.

The rounded corners 15 and 16 of the contact of FIGS. 1–4 are important since they permit a larger contact surface between the legs and the circuit board aperture walls. Consequently, a greater total overall force between the legs and the wall can be obtained without damage to the plated aperture wall or the portion of the circuit board immediately therebehind. Such greater total overall force provides better electrical contact and better mechanical gripping between the contacts and the circuit board aperture wall.

Referring now to FIG. 5, the pin 10 is shown inserted through the circuit board 26 (broken away) with the split portion 12 engaging the walls of aperture 25. The flange portion 19 of the contact is shown abutting against a conductive pad 30. Another conductive pad 31 is shown on the underside of circuit board 26 and is electrically connected to the upper contact pad 30 through the plated walls 33 of aperture 25.

Figure 7:
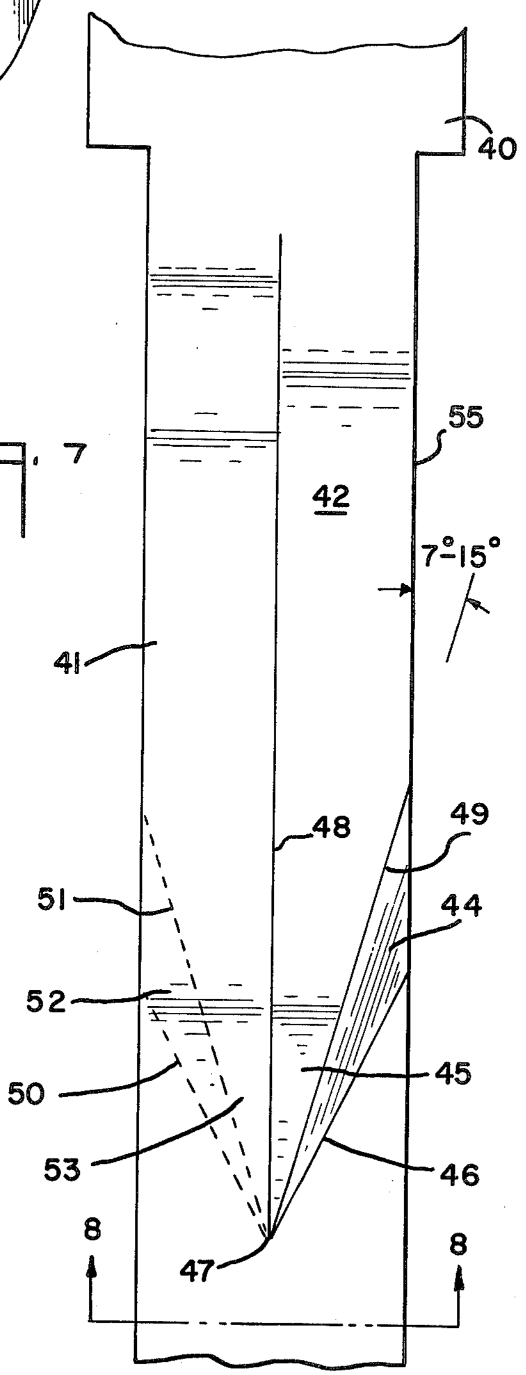
FIG. 7 is a top plan view of the structure of FIG. 6.
Figure 8:
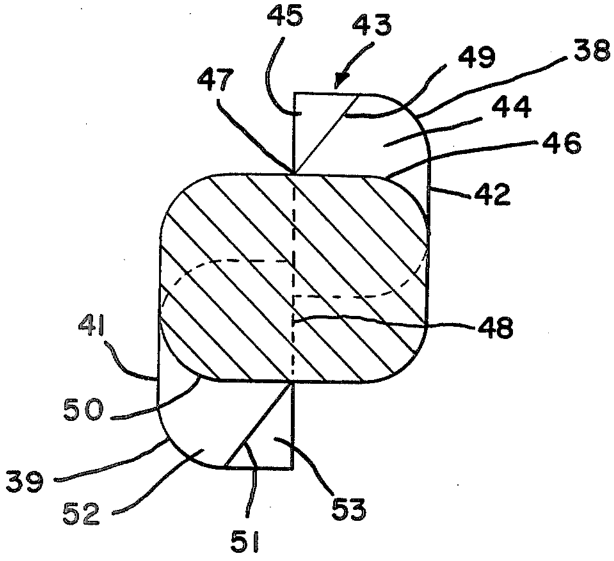
FIG. 8 is an end view of the structure of FIG. 7 taken along the plane 8—8.

Referring now to FIGS. 6, 7 and 8 there is shown another form of the invention wherein the two offset legs 41 and 42 have those ends thereof which first enter apertures in the printed circuit board formed into a pyramidal or wedge-like configuration 43 to prevent rotation of the pin during insertion.

While in some applications a certain amount of rotation of the pin during insertion thereof into the printed circuit board can be tolerated, there are applications in which very little or no significant rotation of the pin can be tolerated. It has been found that the amount of the rotation of the pin varies with the size of the hole, the particular configuration of the end of the two legs, and also the materials of the various components.

In FIG. 1 the pin will tend to rotate in a counterclockwise direction when viewed from the top of the pin as it is inserted into a printed circuit board hole. For many applications, particularly those where the range of hole diameters is narrow and where some rotation can be tolerated, the structure of FIG. 1 functions very well. Within the aforementioned relatively narrow range of hole diameters the amount of rotation can be limited to a few degrees, which is a quite permissible figure for many applications. However, in other applications where the range of hole diameters is larger or the amount of rotation must be kept very low, the structure of FIG. 6 is more suitable.

The principal difference between leg 42 of FIG. 6 and the leg 13 of FIG. 1 is that the leg 42 has the pyramidal-shaped termination 43. Such pyramidal-shaped wedge-shaped termination 43 is defined on one side by a surface 45 laying in the common plane 48, and on the other side by a surface 44 which, at the right hand end, intersects the leg 42 along line 54 and at its left hand end intersects the leg 42 at point 47 which is the apex of the pyramidal-shaped termination 43. The top and bottom edges of the intersection of the surface 44 with leg 42 are designated respectively by reference characters 49 and 46. These intersecting lines 49 and 46 appeared curved in FIG. 6 because surface 44 is intersecting a nonplanar surface.

FIG. 7 shows a top view of the structure of FIG. 6. In FIG. 7 the intersecting lines 49 and 46 are shown as straight lines, although they usually would not be straight lines. Such lines 49 and 46 would be straight if the surface 44 and the surfaces of the leg 42 were all planar. While the surface 44 is usually planar, the surfaces of the leg 42 are not. However, for purposes of simplicity and explanation, assume that leg 42 in FIG. 7, is in fact, formed of planar surfaces and that surface 44 is also planar.

By experimentation it has been found that if the line 49 forms an angle in the approximate range of 7° to 15° with the edge 55 of leg 42 and if the leg 41 is terminated in a similar manner, there will be almost no rotation of the contact shown in FIGS. 6–8 when inserted in a printed circuit board aperture, even though the range of aperture diameters is relatively large. In fact, by making the angle between line 49 and the edge 55 of leg 42 greater than about 15°, the contact can be caused to rotate in a clockwise direction, which is opposite to the direction of rotation of the structure of FIG. 1.

During the insertion of the legs 42 and 41 into a circuit board aperture the edges 49 and 51 function somewhat smaller to the function of the edges on the tip of a metal bit or drill to provide a torque to the legs which is in opposition to the torque generated by the offset relationship of the two legs. More specifically, the torque created by the edges 49 and 51 tends to rotate the legs 42 and 41 in a clockwise direction when viewed in the direction of insertion of the legs and the diagonally positioned edges 38 and 39 tends to rotate the legs in a counter-clockwise direction when viewed in the direction of insertion.

In summary, all of the forces acting on the legs 42 and 41, including the opposing torque forces, are generated by the action between the diagonally positioned outermost edges 38 and 39 of the two legs, including portions 49 and 51 of the outermost edges defined by the pyramidal-shaped terminations 43 and 53. The torque created on the legs in a first angular direction is due primarily to the outermost edges 38 and 39 being positioned a distance off the shear plane 48 to provide a moment of force around the nominal center of the leg assembly whereas the torque in the opposing angular direction is generated by the outermost edges 49 and 51 of the pyramidal-shaped terminations 43 and 53 which extend inwardly towards the shear plane 48 to provide a screw-like action against the aperture wall. It is to be noted that the important structural feature is not the pyramidal-shaped element, per se, but the creation of the edge 49 thereby.

In fact, the entire outermost edge, consisting of edge 42 and edge 49 can be one continuously curved edge which contacts the aperture wall upon insertion of the legs therein, and which has its concave side facing the shear plane.

For any given set of parameters including leg dimensions, hole size and materials, an optimum configuration can be determined for the shape of the outermost edge of the legs over their complete length which will produce the least amount of resultant torque as the legs are inserted in an aperture.

Still referring to FIG. 7, the dotted lines 51 and 50 represent the intersection of a surface 52 with the leg 41 of the contact. The surfaces 53 and 52 of the termination of leg 41 correspond to the surfaces 45 and 44 of the termination of leg 42.

FIG. 8 shows a sectional end view of the structure of FIG. 7 taken along the plane 8—8. It is to be noted that the surface 44 can be vertical so that the lines 46 and 49 in FIG. 8 would coincide, or alternatively, surface 44 can be undercut so that the line 46 makes an angle with side 55 which is less than the angle made by line 49 with side 55. FIG. 8 also shows the surfaces 53 and 52 and the intersecting lines 50 and 51 of leg 41.

Referring now to FIGS. 9, 10 and 11 there is shown another embodiment of the invention in which the termination of the offset legs has a wedge-shaped configuration or portion with the convergent edge of the wedge-shaped configuration terminating on the outermost convex surface of the leg. More specifically, in FIG. 9 the wedge-shaped portion, designated generally by reference character 60, terminates in a convergent edge 61 which lies in the outermost surface 71 of the leg 63 near the junction 62 of said leg 63 and that portion 64 of the contact which passes through and beyond an aperture in a printed circuit board.

One side 65 of the wedge-shaped portion lines in the common shear plane 74 between leg 63 and leg 73. The other side 66 of wedge portion 60 is positioned opposite side 65 and is tapered towards side 65 in the direction of the convergent edge 61 of the wedge-shaped portion 60.

The plane of tapered side 66 can be vertical with respect to the top surface 71 of leg 63 or, alternatively, it can be at an angle, in either direction from said vertical position, within certain limitations. Such limitations are variable and depend upon the material employed in the terminal, the size of the terminal and the size of the aperture in the printed circuit board, as well as other parameters of a given assembly. It is important, however, that the edge 70 of the intersection of side wall 66 and the top surface 71 of the leg 63 be sufficiently sharp to grip the wall of the printed circuit board aperture without appreciable damage thereto, as the legs are inserted into the printed circuit board aperture, to control the rotational torque on the contact.

As in the case of the structure of FIGS. 6–8 the edges 70 and 76 of the wedge-shaped elements 60 and 77 (as shown in FIG. 11) function to provide a clockwise torque to legs 63 and 73 as they are inserted into a circuit board aperture. Such clockwise torque is in opposition to, and tends to equalize, the counter-clockwise torque produced by the offset relationship of the legs and more specifically by the diagonally positioned outer edges 70 and 76 thereof, as said legs 63 and 73 are inserted into a circuit board aperture.

The width of the edge 61 of wedge-shaped portion 60 is variable and can extend from or near the common plane 74 almost out to the side 72 of leg 63, or edge 61 can be an apex (such as apex 47 shown in FIGS. 6, 7 and 8) positioned on the common plane 74. A typical configuration suitable for most applications incorporates an angle of taper in the approximate range of 7° to 15° between side 66 and side 72 of the leg 63.

The second offset leg 73 of FIG. 9 is identical with offset leg 63 except that it is a mirror image thereof, as indicated in FIGS. 10 and 11. Although the configurations of legs 63 and 73 preferably are the same (i.e., mirror images) in any given contact configuration, it might be desirable, under certain design requirements, for the wedge-shaped termination of one leg to be different from the wedge-shaped termination of the other leg.

Referring now to FIGS. 12 through 14 there is shown another embodiment of the invention wherein the two legs forming the split portion of the contact are S-shaped and are identified generally by reference characters 83 and 84. These two S-shaped legs are reversed so that the two corresponding half sections of the legs bow in different directions. More specifically, the half section 85 of leg 83 bows in a different direction from the half section 87 of the other S-shaped leg 84. Similarly, the two half sections 86 and 88 of legs 83 and 84 are bowed in different directions.

The contact of FIG. 12 is shown inserted into aperture 91 in circuit board 80, which is broken away to show the contact therein. A printed circuit pad 82 is shown on circuit board 80 to which the contact can be electrically connected by suitable soldering means (not shown in FIG. 12) or alternatively the contact of FIG. 12 can be retained in the board aperture without solder by means of the retentive action of the legs 83 and 84 upon the wall of the aperture 91 and be electrically connected to circuit pad 82 via the plated walls of aperture 91.

As in the case of the structure shown in FIGS. 1 through 11 the most advantageous means of using the contact of FIG. 12 is to insert the legs through an aperture of one or more circuit boards in a force fitted manner and without the use of solder. The same retention forces are created in the contact of FIGS. 12 through 14 when inserted in a printed circuit board aperture as are created with the structures of FIGS. 1 through 11. Such forces include the relatively large frictional force between the facing and abutting surfaces of the two legs 83 and 84 which lie in the common shear plane 99.

If it is desired to solder the contact of FIGS. 12–14 into a circuit board aperture such solder can be accomplished by a solder deposit, such as solder deposit 92 of FIG. 12, by a solder doughnut positioned around the flange 81 or by other suitable soldering means.

Referring now to FIG. 13 there is shown a side view of the form of the invention employing the S-shaped legs, and illustrates in additional detail the relation between the two S-shaped legs.

FIG. 14 shows another view of the contact of FIG. 12 and specifically shows that the facing surfaces of the two S-shaped legs 83 and 84 abut against each other along a common plane 99. Further, in FIG. 14 the dotted line portion 90 can represent either a complete separation of the two legs 83 and 84, or alternatively, a portion of the split pin which has not been separated. In other words, the S-shaped legs can be separated, one from the other, along their entire length or they can be separated from each other only over the solid lines 95 and 96 of FIG. 14, with the dotted portion 90 representing a portion of the pin in which the two legs have not been separated.

As in the case of the structures of FIGS. 6–8 and 9–10 those ends of the S-shaped legs of FIGS. 12–14 which are first inserted in said aperture can be terminated in pyramidal-shaped or wedge-shaped configurations to control the amount of torque created on the legs as they are inserted into an aperture hole.

The edges of the S-shaped legs which make contact with the walls of the aperture 91 in the printed circuit board 80 preferably are rounded to make better contact with the walls of said aperture 91, which can be a plated-through aperture or can contain a conductive bushing.

Referring now to FIGS. 15 through 19, there are shown forms of the invention in which the cross-sectional configuration of the legs 100 and 101 are such that only those portions of the perimeter thereof along the common shearing plane 112 come into contact with the wall of the circuit board aperture as the legs are inserted therein.

By providing that only those portions of the contact along the common shearing plane 112 contact the aperture wall the torque applied to the pin during insertion is relatively small. However, the frictional force in the shear plane also remains small. Accordingly, the applications of the embodiment of the invention in which the contact between the pins and the aperture walls is near the shear plane are relatively limited since in most applications a large frictional force in the plane of shear is required.

In FIG. 16 there is shown a side view of the structure of FIG. 15 with legs 100 and 101 being shown in their uninserted positions.

FIG. 17 shows a section of FIG. 16 along plane 17—17 of FIG. 16 before the pin is inserted in a circuit board hole. Legs 100 and 101 are shown separated along the common plane 112 but with facing and abutting surfaces laying in said common shear plane 112. The perimeter of the circuit board aperture is represented by circle 105. As the pin enters the aperture 105 the edges 108 and 109 of legs 100 and 101 will come into contact with the wall of the aperture 105 and force the legs 100 and 101 together, as shown in FIGS. 18 and 19.

Referring now to FIGS. 18 and 19 the contact has entered the aperture 105 in circuit board 113. In FIG. 18 only the leg 101 is completely visible, the leg 100 lying thereunder with only a portion showing. In FIG. 19 the two legs 100 and 101 can be seen to be compressed together along the shear plane 112. The force vectors 106 and 107, which represent the forces exerted between the legs 101 and 100 and the wall of aperture 105, are still substantially diametrically opposed and adjacent the shearing plane 112. The remainder of the perimeter of the two legs 100 and 101 do not come into contact with the wall of aperture 105.

Since force vectors 106 and 107 remain adjacent the common plane 112 during the entire time the pin is being inserted in aperture 105, and vary only in magnitude, there is no appreciable torque exerted on legs 100 and 101. Therefore, the legs 100 and 101 experience no significant rotation or twisting as they enter aperture 105.

While the cross-sectional area of the contact of FIGS. 15–19 is shown as being circular, it can also be elliptical or oval. As discussed above, to avoid torque, the main dimensional criteria of the split portion of the contact, whether of oval or circular cross-section, is that when it is inserted in an aperture the largest dimension which symmetrically spans the two legs 100 and 101 is along or near the shear plane 112, as shown in FIG. 19.

In those majority of applications where a large retention force within the aperture is required, the large frictional force which is developed within the shear plane is needed. To obtain such large frictional force the elliptical or oval pins must have their shear planes located in a position such that the physical contacts between the pin and the aperture wall are removed from the shear plane. Such a relationship can be obtained by having the shear plane positioned between the axes of the oval contact.

Further, with contacts having an oval or elliptical cross-sectional area and positioned between the axes, the two legs can be moved apart from each other in either direction along said shear plane. If the legs are separated in one direction the surfaces of the legs that contact the wall of the aperture will be farther removed from the shear plane than they would be if the legs were separated in the other direction. More specifically, FIGS. 20 and 21 show pairs of legs formed from contacts having an oval cross-section and which are inserted in aperture 120. In both FIGS. 20 and 21 the contact is sheared at an angle $\alpha$ with respect to the major axis 115 to form the pair of legs 122 and 123. However, in FIG. 20 the legs are shown to be offset in a different direction than is shown in FIG. 21. The result is that in FIG. 20 the legs contact the aperture 120 at points 119 and 120 which is removed from the shear plane 118 by an angle $\alpha$, whereas in FIG. 21 the legs make contact with the aperture 120 at points 116 and 117 which are close to shear plane 118.

Figure 22:
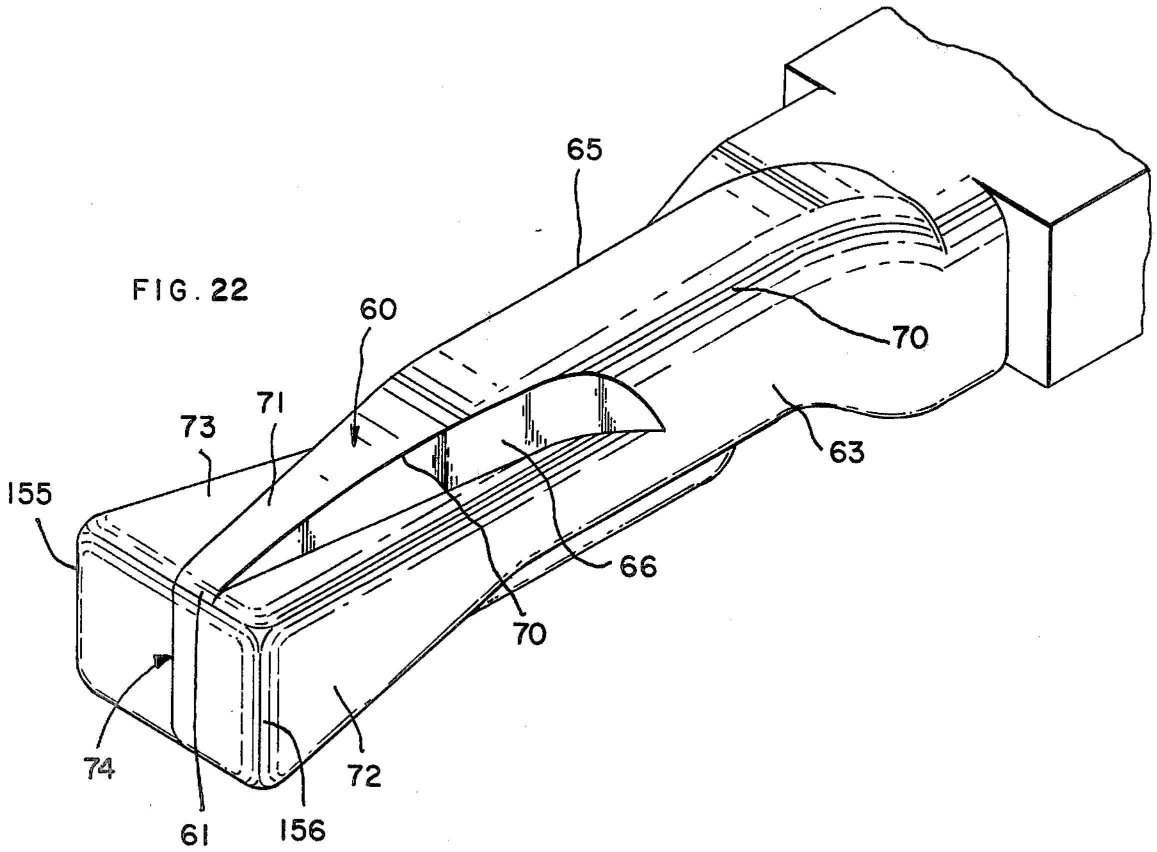
FIG. 22 is a perspective view of a form of the invention in which first ends of the legs are not connected together.

In some applications it is desirable that a terminal post be mounted in a blind aperture, i.e., an aperture that does not extend entirely through a substrate. All of the embodiments of the invention shown and described herein can be adapted for use in such a blind aperture by terminating the terminal posts at the ends of the legs which first enter the aperture. Such first ends of the legs can be connected together, as indicated in the several embodiments described herein or, alternatively, can be separated one from the other. Thus, for example, if the contact of FIG. 9 were cut off at plane A—A the ends of the two legs 63 and 73 would be separated and movable independently of one another. The resultant structure is shown in FIG. 22 wherein the elements which correspond to elements in FIG. 9 are identified by the same reference characters. The shear plane 74 can be seen to extend to the ends of the two legs 63 and 73 which first enter an aperture in a substrate. The edges 155 and 156 of the free ends of legs 63 and 73 can be rounded so they will not gouge into the walls of the aperture.

Alternatively, those ends of the legs 63 and 73 which first enter the aperture can be connected together and the ends of the legs which enter the aperture last can be separated.

In other forms of the invention the number of legs employed can exceed two. For example, three legs can be used with the center leg being bowed in a first direction and the two adjacent outside legs being bowed in the opposite direction, and further with facing and abutting surfaces between the center leg and the outside legs lying in common shear planes.

Further, while the embodiments of the invention have been shown with a shoulder means for seating upon a substrate surface, such as 40 of FIG. 6, such shoulders are not needed in all applications. The position of the post in the board can be determined by other means, such as the depth of thrust of automatic insertion equipment.

It is to be understood that the forms of the invention shown and described herein are but preferred embodiments thereof and that various changes may be made in detailed configuration thereof and in proportional sizes of the various parts thereof without departing from the spirit and scope of the invention.

We claim:

1. A contact for insertion into an aperture extending between upper and lower surfaces of a substrate comprising:

a pair of offset legs extending along a longitudinal axis adapted to extend at least part way through said aperture and to tightly engage the peripheral surface of said aperture;

said legs being joined at their ends for compliant movement throughout their offset lengths relative to each other in a first direction substantially normal to said axis during insertion into said aperture so as to reduce their combined cross-sectional dimension thus permitting accommodation by said aperture;

said legs being in a mutually touching relationship for a majority of the distance they extend into said aperture along longitudinally extending friction surface means in a plane constructed between said legs upon completion of insertion of said legs to their final position of stable support within said aperture;

said plane being so constructed that the maximum combined cross-sectional dimension of said legs is reduced during insertion into said aperture without causing any increase in the combined cross-sectional dimension of said legs in a direction perpendicular to said plane; and said friction surface means resisting said compliant movement of said legs relative to each other in said first direction.

2. A contact as set forth in claim 1 in which:

said legs are offset laterally from each other in said first direction so that the area of mutual contact between said legs is increased as said legs are moved relative to each other in a second direction.

3. A contact as set forth in claim 2 in which:

each of said legs has a second longitudinally extending surface which, prior to insertion of said legs into said aperture, are are spaced apart a distance greater than the diameter of said aperture, said second surfaces engaging the peripheral side of said aperture when said terminal is inserted therein as the result of compliant movement of said legs in said first direction relative to each other.

4. A contact as set forth in claim 2 in which:

each of said legs has a second longitudinally extending surface which, prior to the insertion of said terminal into said aperture, are spaced a distance greater than the diameter of said aperture, said second surfaces engaging the peripheral side of said aperture when said terminal is inserted therein so as to exert a force which causes compliant movement of said legs relative to each other in said first direction and a force which materially compresses said legs in a direction normal to said first direction.

5. The combination of a substrate having an aperture therein and a terminal inserted therein;

said terminal comprising a pair of legs extending along a longitudinal axis coextending at least in part with the axis of said aperture and being offset with respect to each other in a first direction substantially normal to said longitudinal axis;

said legs being joined at their ends for compliant movement throughout their offset lengths relative to each other in said first direction;

said legs being compressed by the peripheral side of said aperture in a mutually touching relationship along longitudinally extending friction surface means in a plane constructed between said legs and so constructed that the compliant movement of said legs during insertion into said aperture does not cause any increase in the combined cross-sectional dimension of said legs in a direction perpendicular to said plane;

said friction surface means generating upon completion of insertion of said legs to their final position of stable support within said aperture a friction force which is a dominant force resisting compliant movement of said legs relative to each other in said first direction.

6. A contact for insertion at least part way into an aperture in a substrate comprising:

a substrate engaging position which is sheared along a longitudinal axis to form at least two adjacent legs connected together at least at first ends thereof and constructed to engage the walls of said aperture when inserted into said aperture;

each of said legs having a shear surface which, upon completion of insertion of said legs to their final position of stable support within said aperture, is slidably engaged for a majority of the distance said legs extend into said aperture with the shear surface of an adjacent leg, with said shear surfaces in a plane constructed between said legs;

said legs being bowed in opposite directions in the direction of said shear surfaces therebetween so as to be offset with respect to each other; and said legs further constructed to respond to the insertion of said legs into said aperture to slide in an overlapping relationship along said shear surfaces and to become pressed against each other by a component of force normal to said shear surfaces so as to generate a frictional force between said legs;

said plane being so constructed that said legs slide along said shear surfaces during insertion into said aperture without causing any increase in their combined cross-sectional dimension in a direction perpendicular to said plane.

7. A contact as in claim 6 and further comprising means for controlling the amount of rotation of said legs as they are inserted in said aperture.

8. A contact as in claim 7 in which said legs each comprise a convex surface generally perpendicular to said shear surface which defines the outermost degree of offset of said legs; and in which said means for controlling the amount of rotation of said legs comprises a pyramidal-shaped configuration formed on the end of each of said legs which first enters said aperture;

said pyramidal-shaped configuration comprising an apex directed towards said first entering end of said leg and defined on a first side by said shear surface and on the side opposite shear first surface by a second surface extending inwardly into said leg from said convex surface to a depth substantially equal to the offset distance of said convex surface and extending from the apex of said pyramidal-shaped configuration at an angle from said first side to the surface of said leg.

9. A contact as in claim 7 in which said legs each comprise a convex surface generally perpendicular to said shear surface which defines the outermost degree of offset of said legs; and in which said means for controlling the amount of rotation of said legs comprises a wedge shaped configuration formed on the end of each of said legs which first enters said aperture;

said wedge-shaped configuration having its convergent end directed towards said first entering end of said leg and defined on a first side by said shear surface and on the side opposite said shear surface by a second surface extending inwardly into said leg from said convex surface to a depth substantially equal to the offset distance of said convex surface and extending from the convergent end of said wedge-shaped configuration at an angle from said first side to the surface of said leg.

10. A contact as in claim 7 in which said component of force normal to said shear surfaces increases the frictional forces between said slidably engaged shear surfaces to resist the movement of said legs toward each other along said shear surfaces.

11. A contact as in claim 10 in which said legs each comprise a convex surface generally perpendicular to said shear surface which defines the outermost degree of offset of said legs; and in which said means for controlling the amount of rotation of said legs comprises a pyramidal-shaped configuration formed on the end of each of said legs which first enters said aperture;

said pyramidal-shaped configuration comprising an apex directed towards said first entering end of said leg and defined on a first side by said shear surface and on the side opposite said first surface by a second surface extending inwardly into said leg from said convex surface to a depth substantially equal to the offset distance of said convex surface and extending from the apex of said pyramidal-shaped configuration at an angle from said first side to the surface of said leg.

12. A contact as in claim 10 in which said legs each comprise a convex surface generally perpendicular to said shear surface which defines the outermost degree of offset of said legs; and in which said means for controlling the amount of rotation of said legs comprises a wedge-shaped configuration formed on the end of each of said legs which first enters said aperture;

said wedge-shaped configuration having its convergent end directed towards said shear entering end of said leg and defined on a first side by said first surface and on the side opposite said first surface by a second surface extending inwardly into said leg from said convex surface to a depth substantially equal to the offset distance of said convex surface and extending from the convergent end of said wedge-shaped configuration at an angle from said first side to the surface of said leg.

13. A contact as in claim 6 in which one of said legs has an S-shaped configuration and the other leg has a reversed S-shaped configuration, with each leg having its shear surface lying in a common plane to form a figure 8-like configuration.

14. A contact as in claim 13 and further comprising means for controlling the amount of rotation of said legs as they are inserted in said aperture.

15. A contact as in claim 14 in which said legs each comprise a convex surface generally perpendicular to said first surface which defines the outermost degree of offset of said legs; and in which said means for controlling the amount of rotation of said legs comprises a pyramidal-shaped configuration formed on the end of each of said legs which first enters said aperture;

said pyramidal-shaped configuration comprising an apex directed towards said first entering end of said leg and defined on a first side by said shear surface and on the side opposite said shear surface by a second surface extending inwardly into said leg from said convex surface to a depth substantially equal to the offset distance of said convex surface and extending from the apex of said pyramidal-shaped configuration at an angle from said first side to the surface of said leg.

16. A contact as in claim 14 in which said legs each comprise a convex surface generally perpendicular to said first surface which defines the outermost degree of offset of said legs; and in which said means for controlling the amount of rotation of said legs comprises a wedge-shaped configuration formed on the end of each of said legs which first enters said aperture;

said wedge-shaped configuration having its convergent end directed towards said first entering end of said leg and defined on a first side by said shear surface and on the side opposite said shear surface by a second surface extending inwardly into said leg from said convex surface to a depth substantially equal to the offset distance of said convex surface and extending from the convergent end of said wedge-shaped configuration at an angle from said first side to the surface of said leg.

17. A contact as in claim 13 in which said component of force normal to said shear surfaces increases the frictional force between said slidably engaged shear surfaces to resist the movement of said legs towards each other along said shear surfaces.

18. A contact means for insertion at least part way into an aperture in a substrate and comprising:

a substrate engaging portion which is sheared along a longitudinal axis to form a pair of legs connected together at least at one end thereof constructed to engage the walls of said aperture when inserted into said aperture;

each of said legs having a shear surface which faces and abuts the shear surface on the adjacent leg and substantially lies in a common plane therewith;

said legs being bowed in opposite directions in the direction of said common plane so as to be offset with respect to each other and constructed to respond to insertion into said aperture to slide in an overlapping relation and to become pressed against each other in a direction normal to said common plane to generate a frictional force between said shear surfaces which is a dominant force resisting the sliding of said legs upon completion of insertion of said legs to their final position of stable support within said aperture;

said common plane being so constructed that said legs slide in an overlapping relation during insertion into said aperture without causing any increase in their combined cross-sectional dimension in a direction perpendicular to said plane.

19. A contact means as in claim 18 and further comprising means for controlling the amount of rotation of said legs as they are inserted in said aperture.

20. A contact means as in claim 19 in which said pair of legs are connected together at both ends thereof.

21. A contact means as in claim 20 in which said legs each comprise a convex surface generally perpendicular to said shear surface which defines the outermost degree of offset of said legs; and in which said means for controlling the amount of rotation of said legs comprises a pyramidal-shaped configuration formed on the end of each of said legs which first enters said aperture;

said pyramidal-shaped configuration comprising an apex directed towards said first entering end of said leg and defined on a first side by said shear surface and on the side opposite said first surface by a second surface extending inwardly into said leg from said convex surface to a depth substantially equal to the offset distance of said convex surface and extending from the apex of said pyramidal-shaped configuration at an angle from said first side to the surface of said leg.

22. A contact means as in claim 20 in which said legs each comprise a convex surface generally perpendicular to said shear surface which defines the outermost degree of offset of said legs; and in which said means for controlling the amount of rotation of said legs comprises a wedge-shaped configuration formed on the end of each of said legs which first enters said aperture;

said wedge-shaped configuration having its convergent end directed towards said first entering end of said leg and defined on a first side by said shear surface and on the side opposite said shear surface by a second surface extending inwardly into said leg from said convex surface to a depth substantially equal to the offset distance of said convex surface and extending from the convergent end of said wedge-shaped configuration at an angle from said first side of the surface of said leg.

23. A contact means as in claim 20 in which one of said leg has an S-shaped configuration and the other leg has a reversed S-shaped configuration, with each leg having its shear surface lying in a common plane to form a figure 8-like configuration.

24. A contact means as in claim 23 in which said legs each comprise a convex surface generally perpendicular to said shear surface which defines the outermost degree of offset of said legs; and in which said means for controlling the amount of rotation of said legs comprises a pyramidal-shaped configuration formed on the end of each of said legs which first enters said aperture;

said pyramidalshaped configuration comprising an apex directed towards said first entering end of said leg and defined on a first side by said shear surface and on the side opposite said shear surface by a second surface extending inwardly into said leg from said convex surface to a depth substantially equal to the offset distance of said convex surface and extending from the apex of said pyramidal-shaped configuration at an angle from said first side to the surface of said leg.

25. A contact means as in claim 23 in which said legs each comprise a convex surface generally perpendicular to said shear surface which defines the outermost degree of offset of said legs; and in which said means for controlling the amount of rotation of said legs comprises a wedge-shaped configuration formed on the end of each of said legs which first enters said aperture;

said wedge-shaped configuration having its convergent end directed towards said first entering end of said leg and defined on a first side by said shear surface and on the side opposite said shear surface by a second surface extending inwardly into said leg from said convex surface to a depth substantially equal to the off set distance of said convex surface and extending from the convergent end of said wedge-shaped configuration at an angle from said first side to the surface of said leg.

26. A contact for insertion through an aperture in a substrate comprising:

a section having a longitudinal axis with first and second end portions and consisting of a pair of legs defined by a shear split extending along said longitudinal axis;

each of said legs having a shear surface which faces and abuts the shear surface of the adjacent leg and lies substantially in a common plane therewith;

said legs further having their longitudinal axes offset with respect to each other in a direction parallel with said common plane and with the greatest distance across the cross sectional area near the center portion of said section being greater than the corresponding distance across the aperture in which said legs are to be inserted;

said legs further constructed to make contact with the walls of said aperture along the line of said greatest distance of said cross sectional area to press said legs against each other in a direction normal to said common plane so as to generate, upon completion of insertion of said legs to their final position of stable support in said aperture, a frictional force between said legs which is a dominant force resisting movement of said legs along said common plane;

said common plane being so constructed that said legs slide in an overlapping relation during insertion into said aperture without causing any increase in their combined cross sectional dimension in a direction perpendicular to said plane, and means for controlling the rotation of said legs as they are inserted in a substrate aperture.

27. A contact as in claim 26 in which said legs each comprise a convex surface generally perpendicular to said shear surface which defines the outermost degree of offset of said legs; and in which said means for controlling the rotation of said legs comprises a pyramidal-shaped configuration formed on the end of each of said legs which first enters said aperture;

said pyramidal-shaped configuration comprising an apex directed towards said first entering end of said leg and defined on a first side by said shear surface and on the side opposite said first surface by a second surface extending inwardly into said leg from said convex surface to a depth substantially equal to the offset distance of said convex surface and extending from the apex of said pyramidal-shaped configuration at an angle from said first side to the surface of said leg.

28. A contact as in claim 26 in which said legs each comprise a convex surface generally perpendicular to said shear surface which defines the outermost degree of offset of said legs; and in which said means for controlling the rotation of said legs comprises a wedge-shaped configuration formed on the end of each of said legs which first enters said aperture;

said wedge-shaped configuration having its convergent end directed toward said first entering end of said leg and defined on a first side by said shear surface and on the side opposite said shear surface by a second surface extending inwardly into said leg from said convex surface to a depth substantially equal to the offset distance of said convex surface and extending from the covergent end of said wedge-shaped configuration at an angle from said first side to the surface of said leg.

29. A contact as in claim 26 in which one of said legs has an S-shaped configuration and the other leg has a reversed S-shaped configuration, with each leg having its shear surface lying in said common plane to form a figure 8-like configuration.

30. A contact for insertion through and extension within an aperture in a substrate and comprising:

a pair of adjacent legs connected together at least at one end thereof formed by splitting an elongate blank along an axis substantially normal to a mid-crosssection of the blank;

said legs each having a split surface which faces and abuts and lies substantially in a common plane with the split surface on the adjacent leg;

said legs being offset with respect to each other in a direction parallel to said common plane, and constructed to have the distance between the outside edges of said legs, which edges contact given areas of the aperture wall, greater initially than the distance between said given areas of contact on said aperture wall to cause said legs to be pressed against each other in a direction normal to said common plane and to slide in an overlapping relationship along said common plane toward said mid-cross-section when inserted in said substrate aperture, so as to generate a friction force between said legs which, upon completion of insertion of said legs to their final position of stable support in said aperture, is a dominant force resisting the sliding of said legs;

said common plane being so constructed that said legs slide in an overlapping relationship during insertion into said aperture without causing any increase in their combined cross-sectional dimension in a direction perpendicular too said plane.

31. A contact as in claim 30 and further comprising means for controlling the rotation of said legs as they are inserted into said aperture.

32. A contact as in claim 31 in which said legs each comprise a convex surface generally perpendicular to said split surface which defines the outermost degree of offset of said legs; and in which said means for controlling the direction and amount of rotation of said legs comprises a pyramidal-shaped configuration formed on the end of each of said legs which first enters said aperture;

said pyramidal-shaped configuration comprising an apex directed towards said first entering end of said leg and defined on a first side by said split surface and on the side opposite said split surface by a second surface extending inwardly into said leg from said convex surface to a depth substantially equal to the offset distance of said convex surface and extending from the apex of said pyramidal-shaped configuration at an angle from said first side to the surface of said leg.

33. A contact as in claim 31 in which said legs each comprise a convex surface generally perpendicular to said split surface defines the outermost degree of offset of said legs; and in which said means for controlling the direction and amount of rotation of said legs comprises a wedge-shaped configuration formed on the end of each of said legs which first enters said aperture;

said wedge-shaped configuration having its convergent end directed towards said first entering end of said leg and defined on a first side by said split surface and on the side opposite said split surface by a second surface extending inwardly into said leg from said convex surface to a depth substantially equal to the offset distance of said convex surface and extending from the convergent end of said wedge-shaped configuration at an angle from said first side to the surface of said leg.

34. A contact as in claim 31 in which one of said legs has an S-shaped configuration and the other leg has a reversed S-shaped configuration, with each leg having its split surface lying in said common plane to form a figure 8-like configuration.

35. A contact for insertion through an aperture defined by walls extending through a substrate and comprising:

a pair of legs having first and second ends connected together at least at said first ends thereof;

said legs each comprising a first surface lying in a common plane with the first surface of the adjacent leg with said first surfaces being physically separate from each other but facing and abutting each other for at least a majority of the distance said contact extends into said aperture;

each leg being offset throughout its length in a bowed manner with respect to the other leg in said common plane and with the distance of said offset being less than the greatest thickness of said legs measured in said direction of offset when said legs are inserted in said aperture;

said legs further constructed to have their greatest overall cross-sectional dimension, measured along a first line normal to the longitudinal direction of said legs when said legs are not inserted in said aperture, larger than the distance across said aperture along a second line substantially coincident with a first line when said legs are inserted into said aperture into their final position of stable support within said aperture;

said common plane being so constructed that the maximum overall cross-sectional dimension of said legs is reduced during insertion into said aperture without causing any increase in the overall cross-sectional dimension of said legs in a direction perpendicular to said common plane.

36. A contact as in claim 35 and further comprising means for controlling the amount of rotation of said legs as they are inserted in said aperture.

37. A contact as in claim 36 in which said legs each comprise a convex surface generally perpendicular said shear surface which defines the outermost degree of offset of said legs; and in which said means for controlling the amount of rotation of said legs comprises a pyramidal-shaped configuration formed on the end of each of said legs which first enters said aperture;

said pyramidal-shaped configuration comprising an apex directed towards said first entering end of said leg and defined on a first side by said shear surface and on the side opposite said shear surface by a second surface extending inwardly into said leg from said convex surface to a depth substantially equal to the offset distance of said convex surface and extending from the apex of said pyramidal-shaped configuration at an angle from said first side to the surface of said leg.

38. A contact as in claim 36 in which said legs each comprise a convex surface generally perpendicular to said first surface which defines the outermost degree of offset of said legs; and in which said means for controlling the amount of rotation of said legs comprises a wedge-shaped configuration formed on the end of each of said legs which first enters said aperture;

said wedge-shaped configuration having its convergent end directed towards said first entering end of said leg and defined on a first side by said first surface and on the side opposite said first surface by a second surface extending inwardly into said leg from said convex surface to a depth substantially equal to the offset distance of said convex surface and extending from the convergent end of said wedge-shaped configuration at an angle from said first side to the surface of said leg.

* * * * *

REEXAMINATION CERTIFICATE (527th)

United States Patent [19]

[11] B1 4,186,982

Cobaugh et al.

[45] Certificate Issued Jul. 15, 1986

[54] CONTACT WITH SPLIT PORTION FOR ENGAGEMENT WITH SUBSTRATE

[75] Inventors: Robert F. Cobaugh, Elizabethtown; James R. Coller, Mechanicsburg, both of Pa.

[73] Assignee: AMP Incorporated, Harrisburg, Pa.

Reexamination Request:
No. 90/000,640, Sep. 28, 1984

Reexamination Certificate for:

| | |
|---|---|
| Patent No.: | **4,186,982** |
| Issued: | **Feb. 5, 1980** |
| Appl. No.: | **810,703** |
| Filed: | **Jun. 28, 1977** |

Related U.S. Application Data

[63] Continuation-in-part of Ser. No. 698,240, Jun. 21, 1976, abandoned, which is a continuation of Ser. No. 481,577, Jun. 21, 1974, abandoned, which is a continuation-in-part of Ser. No. 440,899, Feb. 8, 1974, abandoned, which is a continuation-in-part of Ser. No. 384,852, Aug. 1, 1973, abandoned.

[51] Int. Cl.$^{4}$ .......................... H01R 9/09; H05K 1/12

[52] U.S. Cl. .............................. 339/17 C; 339/221 M

[56] References Cited

U.S. PATENT DOCUMENTS

| | | | |
|---|---|---|---|
| 707,756 | 8/1902 | Brown | 411/513 |
| 919,925 | 4/1909 | McWhorter | 411/513 |
| 2,006,813 | 7/1935 | Norwood | 411/352 |
| 2,542,609 | 2/1951 | Wyglendowski | 339/196 A |
| 2,898,964 | 8/1959 | Masters | 411/166 |
| 3,230,493 | 1/1966 | Jensen et al. | 339/17 |
| 3,400,358 | 9/1968 | Byrnes | 339/17 |
| 3,696,323 | 10/1972 | Kinkaid | 339/192 R |
| 3,751,960 | 8/1973 | Morton et al. | 72/326 |
| 3,783,433 | 1/1974 | Kurtz et al. | 339/17 C |
| 3,997,237 | 12/1976 | White | 339/275 B |
| 4,066,326 | 1/1978 | Lovendusky | 339/221 M |

FOREIGN PATENT DOCUMENTS

| | | |
|---|---|---|
| 1132614 | 7/1962 | Fed. Rep. of Germany . |
| 2435461 | 10/1983 | Fed. Rep. of Germany . |
| 2525640 | 12/1983 | Fed. Rep. of Germany . |
| 736058 | 9/1932 | France . |
| 1268834 | 6/1961 | France . |
| 1126275 | 12/1965 | France . |
| 2239840 | 7/1974 | France . |
| 2275902 | 1/1976 | France . |
| 891418 | 3/1962 | United Kingdom . |

OTHER PUBLICATIONS

Rawl Catalog No. 30, 1966, pp. 28-31.
Federal Specification FF-S-325, 1957, p. D006320.

*Primary Examiner*—Neil Abrams

[57] ABSTRACT

A contact for use in printed circuit boards in which a portion thereof is split or sheared to form at least a pair of legs for insertion into an aperture in said circuit board with the adjacent legs each having a surface which face and abut each other in the shear plane therebetween and with said legs being offset with respect to each other in said shear plane. When the offset legs are inserted in an aperture in a circuit board they are forced towards each other along the shear plane with the facing surfaces experiencing a strong component of force normal to said shear plane. Such normal force in turn produces a large frictional force between said facing surfaces which, together with the spring-like force generated as the legs are forced together, produce a strong opposing force against the walls of the aperture. The foregoing structure enables the use of compliant legs having a larger total cross-sectional area with respect to a printed circuit board aperture of a given size than has heretofore been possible. Further, because of such larger cross-sectional area and the large frictional contact between the leg surfaces in the plane of shear the said legs exert a greater force against the wall of the printed circuit board hole without damaging said wall than obtainable with prior devices, thereby creating both an improved electrical contact and an improved mechanical contact. In some embodiments of the invention means are provided to control the direction and amount of rotation of the legs as they are inserted into the printed circuit board aperture.

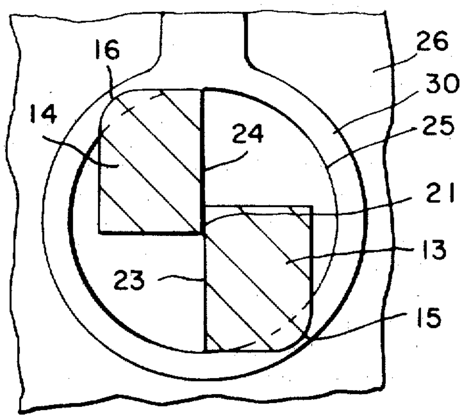

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-17 and 36-38 is confirmed.

Claims 18-35 are cancelled.

New claims 39-53 are added and determined to be patentable.

*39. An electric contact for insertion into an aperture extending between upper and lower surfaces of a printed circuit board substrate comprising:*

*at least two offset legs extending along a longitudinal axis adapted to extend at least part way through said aperture in said printed circuit board and to tightly engage the peripheral surface of said aperture;*

*said legs being joined at their ends for compliant movement throughout their offset lengths relative to each other in a first direction substantially normal to said axis during insertion into said aperture in said printed circuit board so as to reduce their combined cross-sectional dimension thus permitting accommodation by said aperture;*

*said legs being in a mutually touching relationship for a majority of the distance they extend into said printed circuit board aperture along longitudinally extending friction surface means in a plane constructed between said legs upon completion of insertion of said legs to their final position of stable support within said aperture;*

*said plane being so constructed that the maximum combined cross-sectional dimension of said legs is reduced during insertion into said aperture without causing any increase in the combined cross-sectional dimension of said legs in a direction perpendicular to said plane; and*

*said friction surface means resisting said compliant movement of said legs relative to each other in said first direction during insertion of said electric contact into said printed circuit board.*

*40. The combination of an electric contact and a printed circuit board substrate comprising:*

*a printed circuit board including at least one aperture;*

*an electric contact including at least two offset legs extending along a longitudinal axis and extending at least part way through said aperture and tightly engaging the peripheral surface of said aperture;*

*said legs on said electric contact being joined at their ends for compliant movement throughout their offset lengths relative to each other in a first direction substantially normal to said axis during insertion into said aperture so as to reduce their combined cross-sectional dimension thus permitting accommodation by said aperture;*

*said legs on said electric contact being in a mutually touching relationship for a majority of the distance they extend into said aperture along longitudinally extending friction surface means in a plane constructed between said legs upon completion of insertion of said legs to their final position of stable support within said aperture;*

*said plane being so constructed that the maximum combined cross-sectional dimension of said legs is reduced during insertion into said aperture without causing any increase in the combined cross-sectional dimension of said legs in a direction perpendicular to said plane; and*

*said friction surface means resisting said compliant movement of said legs relative to each other in said first direction during insertion of said electric contact into said printed circuit board.*

*41. An electric contact for insertion into an aperture extending between upper and lower surfaces of a printed circuit board substrate comprising:*

*a pair of offset legs extending along a longitudinal axis adapted to extend at least part way through said aperture in said printed circuit board and to tightly engage the peripheral surface of said aperture;*

*said legs being joined at their ends for compliant movement throughout their offset lengths relative to each other in a first direction substantially normal to said axis during insertion into said aperture so as to reduce their combined cross-sectional dimension thus permitting accommodation by said aperture;*

*said legs being in a mutually touching relationship for a majority of the distance they extend into said aperture along longitudinally extending friction surface means in a plane constructed between said legs upon completion of insertion of said legs to their final position of stable support within said aperture;*

*said plane being so constructed that the maximum combined cross-sectional dimension of said legs is reduced during insertion into said aperture without causing any increase in the combined cross-sectional dimension of said legs in a direction perpendicular to said plane;*

*each of said legs having a second longitudinally extending surface which, prior to the insertion of said terminal into said aperture, are spaced a distance greater than the diameter of said aperture, said second surfaces engaging the peripheral side of said aperture when said terminal is inserted therein so as to exert a force which causes compliant movement of said legs relative to each other in said first direction and a force which materially compresses said legs in a direction normal to said first direction; and*

*said friction surface means resisting said compliant movement of said legs relative to each other in said first direction during insertion of said electric contact.*

*42. An electric contact for insertion at least part way into an aperture in a printed circuit board substrate comprising:*

*a substrate engaging portion which is sheared along a longitudinal axis to form at least two adjacent legs connected together at least at first ends thereof and constructed to engage the walls of said aperture when inserted into said aperture in said printed circuit board;*

*each of said legs having a shear surface which, upon completion of insertion of said legs to their final position of stable support within said aperture, is slidably* engaged for a majority of the distance said legs extend into said aperture with the shear surface of an adjacent leg, with said shear surfaces in a plane constructed between said legs;

said legs being bowed in opposite directions in the direction of said shear surfaces therebetween so as to be offset with respect to each other;

said legs further constructed to respond to the insertion of said legs into said aperture to slide in an overlapping relationship along said shear surfaces and to become pressed against each other by a component of force normal to said shear surfaces so as to generate a frictional force between said legs; and said plane being so constructed that said legs slide along said shear surfaces during insertion into said aperture without causing any increase in their combined cross-sectional dimension in a direction perpendicular to said plane.

43. An electric contact for insertion through an aperture defined by walls extending through a printed circuit board substrate comprising:

a pair of legs having first and second ends connected together at least at said first ends thereof;

said legs each comprising a first surface lying in a common plane with the first surface of the adjacent leg with said first surfaces being physically separate from each other but facing and abutting each other for at least a majority of the distance said contact extends into said aperture in said printed circuit board;

each leg being offset throughout its length in a bowed manner with respect to the other leg in said common plane and with the distance of said offset being less than the greatest thickness of said legs measured in said direction of offset when said legs are inserted in said aperture in said printed circuit board;

said legs further constructed to have their greatest overall cross-sectional dimension, measured along a first line normal to the longitudinal direction of said legs when said legs are not inserted in said aperture, larger than the distance across said aperture along a second line substantially coincident with a first line when said legs are inserted into said aperture into their final position of stable support within said aperture in said printed circuit board; and said common plane being so constructed that the maximum overall cross-sectional dimension of said legs is reduced during insertion into said aperture in said printed circuit board without causing any increase in the overall cross-sectional dimension of said legs in a direction perpendicular to said common plane.

44. An electric contact for insertion into an aperture extending between upper and lower surfaces of a printed circuit board substrate comprising:

at least two offset legs extending along a longitudinal axis adapted to extend at least part way through said aperture in said printed circuit board and to tightly engage the peripheral surface of said aperture;

each of said legs having a shear surface;

said legs being joined at their ends for compliant movement throughout their offset lengths relative to each other in a first direction substantially normal to said axis during insertion into said aperture so as to reduce their combined cross-sectional dimension thus permitting accommodation by said aperture;

said shear surfaces on said legs being in a mutually touching relationship for a majority of the distance they extend into said aperture along longitudinally extending friction surface means in a plane constructed between said legs upon completion of insertion of said legs to their final position of stable support within said aperture;

said plane being so constructed that the maximum combined cross-sectional dimension of said legs is reduced during insertion into said aperture without causing any increase in the combined cross-sectional dimension of said legs in a direction perpendicular to said plane; and said friction surface means on said shear surfaces resisting said compliant movement of said legs relative to each other in said first direction during insertion of said electric contact into said printed circuit board.

45. An electric contact for insertion into an aperture extending between upper and lower surfaces of a printed circuit board substrate comprising:

at least two offset legs extending along a longitudinal axis adapted to extend at least part way through said aperture in said printed circuit board and to tightly engage the peripheral surface of said aperture;

each of said legs having a shear surface;

said legs being joined at their ends for compliant movement throughout their offset lengths relative to each other in a first direction substantially normal to said axis during insertion into said aperture so as to reduce their combined cross-sectional dimension thus permitting accommodation by said aperture;

each of said legs having a second longitudinally extending surface which, prior to the insertion of said terminal into said aperture, are spaced a distance greater than the diameter of said aperture, said second surfaces engaging the peripheral side of said aperture when said terminal is inserted therein so as to exert a force which causes compliant movement of said legs relative to each other in said first direction and a force which materially compresses said legs in a direction normal to said first direction;

said shear surfaces on said legs being in a mutually touching relationship for a majority of the distance they extend into said aperture along longitudinally extending friction surface means in a plane constructed between said legs upon completion of insertion of said legs to their final position of stable support within said aperture;

said plane being so constructed that the maximum combined cross-sectional dimension of said legs is reduced during insertion into said aperture without causing any increase in the combined cross-sectional dimension of said legs in a direction perpendicular to said plane; and said friction surface means on said shear surfaces resisting said compliant movement of said legs relative to each other in said first direction during insertion of said electric contact into said printed circuit board.

46. The combination of an electric contact and a printed circuit board substrate comprising:

a printed circuit board including at least one aperture;

an electric contact including at least two offset legs extending along a longitudinal axis and extending at least part way through said aperture and tightly engaging the peripheral surface of said aperture;

said legs on said electric contact being joined at their ends for compliant movement throughout their offset lengths relative to each other in a first direction substantially normal to said axis during insertion into said aperture so as to reduce their combined cross-sectional dimension thus permitting accommodation by said aperture;

each of said legs including a shear surface;

said shear surfaces on said legs being in a mutually touching relationship for a majority of the distance they extend into said aperture along longitudinally extending friction surface means in a plane constructed between said legs upon completion of insertion of said legs to their final position of stable support within said aperture;

said plane being so constructed that the maximum combined cross-sectional dimension of said legs is reduced during insertion into said aperture without causing any increase in the combined cross-sectional dimension of said legs in a direction perpendicular to said plane; and said friction surface means on said shear surfaces resisting said compliant movement of said legs relative to each other in said first direction during insertion of said electric contact into said printed circuit board.

47. An electric contact for insertion into a plated through hole including upper and lower edges and a peripheral internal surface extending between upper and lower surfaces of a printed circuit board comprising:

at least two offset legs extending along a longitudinal axis adapted to extend at least part way through said plated through hole and to tightly engage the peripheral surface of said plated through hole;

each of said legs having a substantially planar shear surface, said shear surfaces being substantially parallel to each other;

said legs being joined at both ends for compliant movement throughout their offset lengths relative to each other in a first direction substantially normal to said axis during insertion into said plated through hole so as to reduce their combined cross-sectional dimension thus permitting accommodation by said plated through hole;

each of said legs having a second longitudinally extending, linear surface which, prior to the insertion of said contact into said plated through hole, are spaced a distance greater than the diameter of said plated through hole, said second surfaces engaging the peripheral side of said plated through hole when said contact is inserted therein so as to exert a force which causes compliant movement of said legs relative to each other in said first direction and a force which acts upon said legs in a direction normal to said first direction;

said second surfaces being substantially parallel to each other and tightly engaging said peripheral surface of said plated through hole when said electric contact is inserted in said plated through hole and exerting a radial force on said peripheral surface sufficient to retain said pin in said plated through hole without other means of retention;

said shear surfaces on said legs being in a mutually touching relationship for a majority of the distance they extend into said plated through hole along longitudinally extending friction surface means in a plane constructed between said legs upon completion of insertion of said legs to their final position of stable support within said plated through hole;

said plane being so constructed that the maximum combined cross-sectional dimension of said legs is reduced during insertion into said plated through hole without causing any increase in the combined cross-sectional dimension of said legs in a direction perpendicular to said plane; and said friction surface means on said shear surfaces resisting said compliant movement of said legs relative to each other in said first direction during insertion of said electric contact into said printed circuit board.

48. The combination of an electric contact inserted into a plated through hole extending between upper and lower surfaces of a printed circuit board comprising:

a printed circuit board including a plated through hole defined by a generally cylindrical internal peripheral surface and upper and lower circular edges;

an electric contact including at least two offset legs extending along a longitudinal axis adapted to extend at least part way through said plated through hole and tightly engaging the peripheral surface of said plated through hole;

each of said legs having a substantially planar shear surface, said shear surfaces being substantially parallel to each other;

said legs being joined at both ends for compliant movement throughout their offset lengths relative to each other in a first direction substantially normal to said axis during insertion into said plated through hole so as to reduce their combined cross-sectional dimension thus permitting accommodation by said plated through hole;

each of said legs having a second longitudinally extending, linear surface which, prior to the insertion of said contact into said plated through hole, are spaced a distance greater than the diameter of said plated through hole, said second surfaces engaging the peripheral side of said plated through hole when said contact is inserted therein so as to exert a force which causes compliant movement of said legs relative to each other in said first direction and a force which acts upon said legs in a direction normal to said first direction;

said second surfaces being substantially parallel to each other and tightly engaging said peripheral surface of said plated through hole and exerting a radial force on said peripheral surface sufficient to retain said pin in said plated through hole without other means of retention;

said shear surfaces on said legs being in a mutually touching relationship for a majority of the distance they extend into said plated through hole along longitudinally extending friction surface means in a plane constructed between said legs upon completion of insertion of said legs to their final position of stable support within said plated through hole;

said plane being so constructed that the maximum combined cross-sectional dimension of said legs is reduced during insertion into said plated through hole without causing any increase in the combined cross-sectional dimension of said legs in a direction perpendicular to said plane; and said friction surface means on said shear surfaces resisting said compliant movement of said legs relative to each other in said first direction during insertion of said electric contact into said printed circuit board.

49. An electric contact for insertion into a plated through hole including upper and lower edges and a peripheral internal surface extending between upper and lower surfaces of a printed circuit board comprising:

at least two offset legs extending along a longitudinal axis adapted to extend at least part way through said plated through hole and to tightly engage the peripheral surface of said plated through hole;

each of said legs having a substantially planar shear surface, said shear surfaces being substantially parallel to each other;

said legs being substantially rectangular in cross-section;

said legs being joined at both ends for compliant movement throughout their offset lengths relative to each other in a first direction substantially normal to said axis during insertion into said plated through hole so as to reduce their combined cross-sectional dimension thus permitting accommodation by said plated through hole;

each of said legs having a second longitudinally extending, linear surface being curvi-linear in cross-section, which, prior to the insertion of said contact into said plated through hole, are spaced a distance greater than the diameter of said plated through hole, said second surfaces engaging the peripheral side of said plated through hole when said contact is inserted therein so as to exert a force which causes compliant movement of said legs relative to each other in said first direction and a force which acts upon said legs in a direction normal to said first direction;

said second surfaces being substantially parallel to each other and tightly engaging said peripheral surface of said plated through hole when said electric contact is inserted in said plated through hole and exerting a radial force on said peripheral surface sufficient to retain said pin in said plated through hole without other means of retention;

said shear surfaces on said legs being in a mutually touching relationship for a majority of the distance they extend into said plated through hole along longitudinally extending friction surface means in a plane constructed between said legs upon completion of insertion of said legs to their final position of stable support within said plated through hole;

said plane being so constructed that the maximum combined cross-sectional dimension of said legs is reduced during insertion into said plated through hole without causing any increase in the combined cross-sectional dimension of said legs in a direction perpendicular to said plane; and said friction surface means on said shear surfaces resisting said compliant movement of said legs relative to each other in said first direction during insertion of said electric contact into said printed circuit board.

50. The combination of an electric contact inserted into a plated through hole extending between upper and lower surfaces of a printed circuit board comprising:

a printed circuit board including a plated through hole defined by a generally cylindrical internal peripheral surface and upper and lower circular edges;

an electric contact including at least two offset legs extending along a longitudinal axis adapted to extend at least part way through said plated through hole and tightly engaging the peripheral surface of said plated through hole;

each of said legs having a substantially planar shear surface, said shear surfaces being substantially parallel to each other;

said legs being substantially rectangular in cross-section;

said legs being joined at both ends for compliant movement throughout their offset lengths relative to each other in a first direction substantially normal to said axis during insertion into said plated through hole so as to reduce their combined cross-sectional dimension thus permitting accommodation by said plated through hole;

each of said legs having a second longitudinally extending, linear surface being curvi-linear in cross-section, which, prior to the insertion of said contact into said plated through hole, are spaced a distance greater than the diameter of said plated through hole, said second surfaces engaging the peripheral side of said plated through hole when said contact is inserted therein so as to exert a force which causes compliant movement of said legs relative to each other in said first direction and a force which acts upon said legs in a direction normal to said first direction;

said second surfaces being substantially parallel to each other and tightly engaging said peripheral surface of said plated through hole and exerting a radial force on said peripheral surface sufficient to retain said pin in said plated through hole without other means of retention;

said shear surfaces on said legs being in a mutually touching relationship for a majority of the distance they extend into said plated through hole along longitudinally extending friction surface means in a plane constructed between said legs upon completion of insertion of said legs to their final position of stable support within said plated through hole;

said plane being so constructed that the maximum combined cross-sectional dimension of said legs is reduced during insertion into said plated through hole without causing any increase in the combined cross-sectional dimension of said legs in a direction perpendicular to said plane; and said friction surface means on said shear surfaces resisting said compliant movement of said legs relative to each other in said first direction during insertion of said electric contact into said printed circuit board.

51. A contact as in claim 50 and further comprising means for controlling the amount of rotation of said legs as they are inserted in said plated through hole.

52. A contact as in claim 51 in which said legs each comprise a convex surface generally perpendicular to said shear surface which defines the outermost degree of offset of said legs; and in which said means for controlling the amount of rotation of said legs comprises a pyramidal-shaped configuration formed on the end of each of said legs which first enters said plated through hole;

said pyramidal-shaped configuration comprising an apex directed towards said first entering end of said leg and defined on a first side by said shear surface and on the side opposite said shear surface by a second surface extending inwardly into said leg from said convex surface to a depth substantially equal to the offset distance of said convex surface and extending from the apex of said pyramidal-shaped configuration at an angle from said first side to the surface of said leg.

53. A contact as in claim 51 in which said legs each comprise a convex surface generally perpendicular to said shear surface which defines the outermost degree of offset of said legs; and in which said means for controlling the amount of rotation of said legs comprises a wedge-shaped configuration formed on the end of each of said legs which first enters said plated through hole;

said wedge-shaped configuration having its convergent end directed towards said first entering end of said leg and defined on a first side by said shear surface and on the side opposite said shear surface by a second surface extending inwardly into said leg from said convex surface to a depth substantially equal to the offset distance of said convex surface and extending from the convergent end of said wedge-shaped configuration at an angle from said first side to the surface of said leg.

* * * * *